(12) United States Patent
Maeda

(10) Patent No.: US 6,777,283 B2
(45) Date of Patent: Aug. 17, 2004

(54) SEMICONDUCTOR DEVICE AND METHOD OF MANUFACTURING SAME

(75) Inventor: Shigenobu Maeda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/294,625

(22) Filed: Nov. 15, 2002

(65) Prior Publication Data

US 2003/0094636 A1 May 22, 2003

Related U.S. Application Data

(62) Division of application No. 09/832,889, filed on Apr. 12, 2001, now Pat. No. 6,512,258.

(30) Foreign Application Priority Data

Oct. 31, 2000 (JP) .................................... P2000-332246

(51) Int. Cl.⁷ .......................................... H01L 21/8238
(52) U.S. Cl. ...................................... 438/231; 257/371
(58) Field of Search ............................... 438/153–154, 438/227–228, 230–233, 199, 217, 303, 305; 257/344, 371, 408

(56) References Cited

U.S. PATENT DOCUMENTS

| | | | |
|---|---|---|---|
| 4,577,391 A | | 3/1986 | Hsia et al. |
| 4,764,477 A | * | 8/1988 | Chang et al. ............... 438/231 |
| 4,843,023 A | * | 6/1989 | Chiu et al. ................. 438/231 |
| 4,876,213 A | * | 10/1989 | Pfiester ...................... 438/231 |
| 5,021,354 A | | 6/1991 | Pfiester |
| 5,668,024 A | * | 9/1997 | Tsai et al. .................. 438/199 |
| 5,696,012 A | | 12/1997 | Son |
| 5,854,101 A | | 12/1998 | Wu |
| 5,965,464 A | | 10/1999 | Tsai et al. |
| 5,994,743 A | | 11/1999 | Masuoka |
| 6,316,304 B1 | * | 11/2001 | Pradeep et al. ............. 438/230 |

FOREIGN PATENT DOCUMENTS

| | | |
|---|---|---|
| JP | 10-84045 | 3/1998 |
| TW | 355821 | 4/1999 |

* cited by examiner

*Primary Examiner*—David Nelms
*Assistant Examiner*—David Vu
(74) *Attorney, Agent, or Firm*—Oblon, Spivak, McClelland, Maier & Neustadt, P.C.

(57) ABSTRACT

Provided are a semiconductor device that optimizes the operation characteristics such as of both an insulating gate type transistor for high voltage and an insulating gate type transistor for low voltage, and a method of manufacturing the same. Specifically, a patterned resist is formed so as to cover a low voltage operation region, a second LDD implantation process of implanting an impurity ion by using the resist as a mask, is performed over a silicon oxide film thereby to form an impurity diffusion region in the surface of a semiconductor substrate in a high voltage operation region. After this step, the silicon oxide film in the high voltage operation region contains the impurity during the second LDD implantation process whereas the silicon oxide film in a low voltage operation region contains no impurity. This leads to such a characteristic that in the following pre-treatment with a wet process, the silicon oxide film containing the impurity in the high voltage operation region is reduced in thickness, and the silicon oxide film containing no impurity in the low voltage operation region is not reduced in thickness.

11 Claims, 19 Drawing Sheets

F I G . 1 1
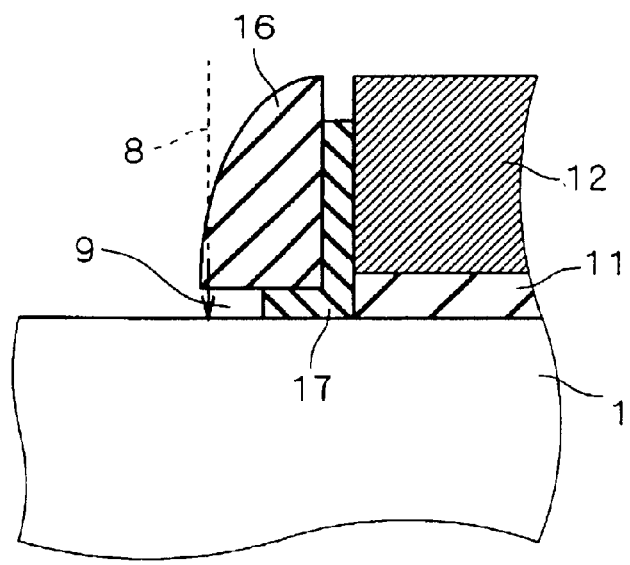
F I G . 1 2
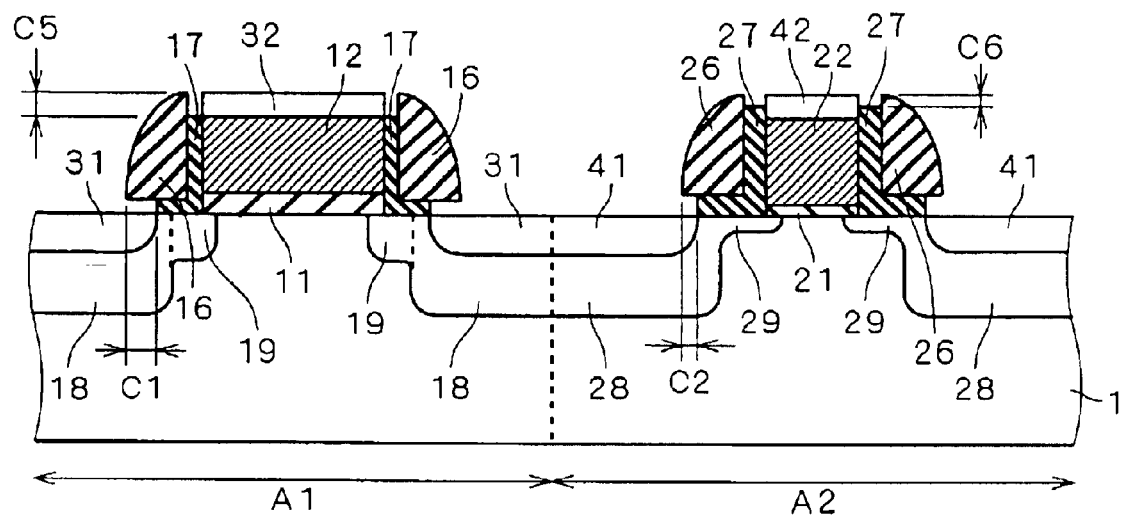

F I G . 18
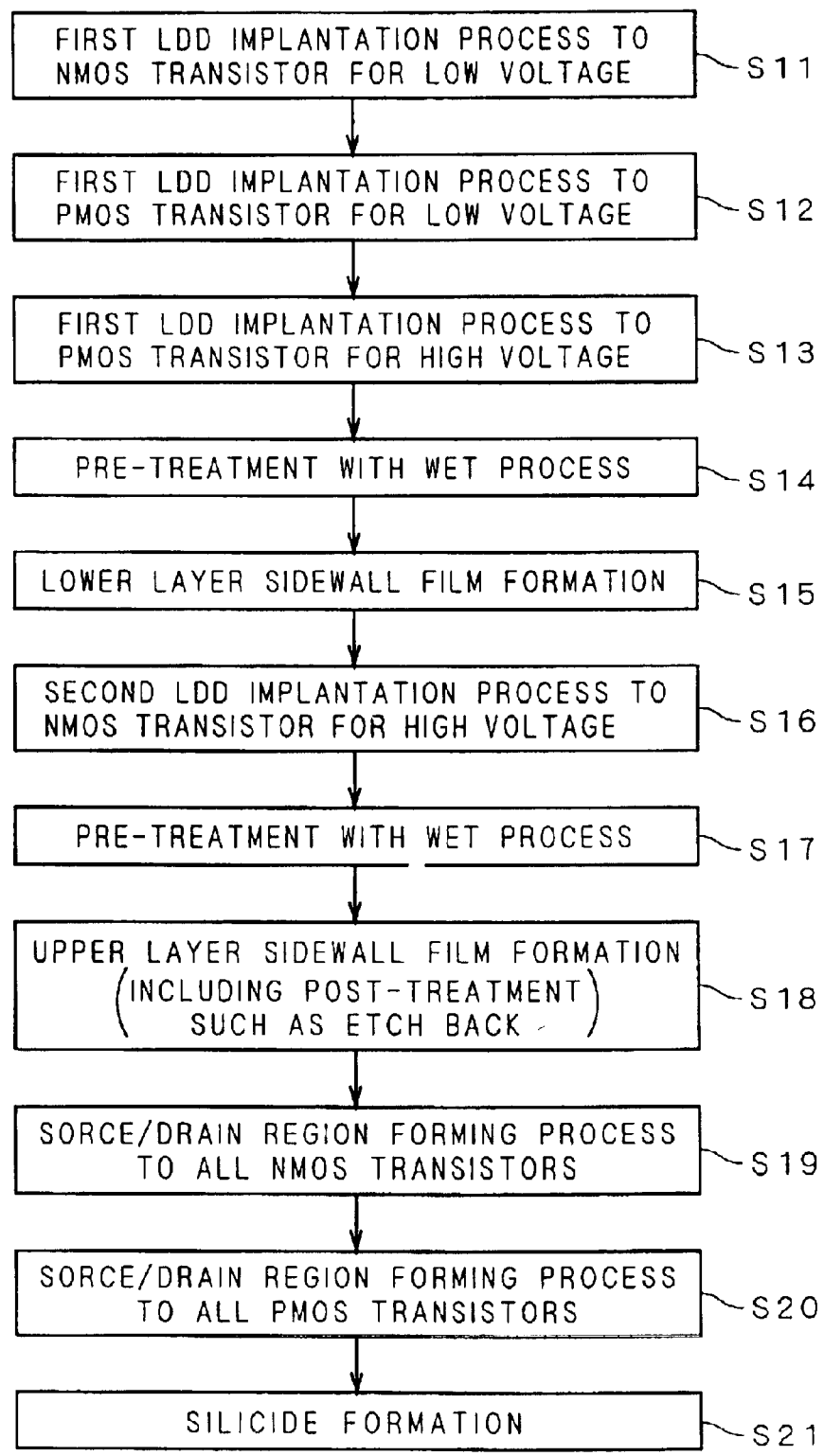

SEMICONDUCTOR DEVICE AND METHOD OF MANUFACTURING SAME

CROSS-REFERENCE TO RELATED APPLICATION

The present application claims priority under 35 U.S.C. §119 to Japanese Patent Application No. 2000-332246, filed Oct. 31, 2000, and under 35 U.S.C. §120 to U.S. patent application Ser. No. 09/832,889 filed Apr. 12, 2001 now U.S. Pat. No. 6,512,258.

BACKGROUND OF THE INVENTION

1. Field of the Invention

The present invention relates to a semiconductor device containing an insulating gate type transistor and to a method of manufacturing the same.

2. Description of the Background Art

Conventionally, a semiconductor device containing an insulating gate type transistor such as a MOS transistor has been manufactured with a method in which a transistor for high voltage and a transistor for low voltage (high speed) are formed simultaneously on one chip (wafer). That is, in order to reduce the number of steps as many as possible, the insulating gate type transistor comprising a high voltage part and a low voltage part has been formed with a fewer steps.

However, it has been very difficult to realize the high voltage part and low voltage part at such a level that a high breakdown voltage characteristic of the high voltage part and a high speed characteristic of both parts are satisfied simultaneously while maintaining a small number of steps.

It has been a conventional practice that the high and low voltage parts are made in different steps. For instance, a gate insulting film for high voltage and that for low voltage are formed in different steps, and the step of an LDD implantation (a first impurity implantation for forming a region that becomes an LDD region) is performed separately in the high voltage part and low voltage part.

FIGS. 24 to 28 are sectional views illustrating a sequence of steps in a conventional method of manufacturing a semiconductor device containing a transistor for high voltage and a transistor for low voltage. The conventional method will be described by referring to these figures.

Referring to FIG. 24, an insulating film 2 having a relatively large thickness is formed on a semiconductor substrate 1 such as a silicon substrate.

Referring to FIG. 25, a patterned resist 3 is formed so as to cover the surface of a high voltage operation region A1. By using the resist 3 as a mask, an etching process to the insulating film 2 is performed to remove the insulating film 2 formed on the surface of a low voltage operation region A2.

Referring to FIG. 26, the resist 3 is then removed and an insulating film having a relatively small thickness is formed on the entire surface. Thereby, an insulating film 4 is formed in the low voltage operation region A2 and the thickness of the insulating film 2 in the high voltage operation region A1 is slightly increased. Subsequently, a conductive layer 5 is deposited on the entire surface.

Referring to FIG. 27, the conductive layer 5 is selectively etched so that a gate insulating film 61 and a gate electrode 62 are formed in the high voltage operation region A1, and a gate insulating film 71 and a gate electrode 72 are formed in the low voltage operation region A2 at the same time. In this case, the gate insulating film 61 is formed so as to have a larger thickness than the gate insulating film 71, and the gate electrode 62 is formed so as to have a longer gate length than the gate electrode 72.

Subsequently, a first LDD implantation process for forming an impurity diffusion region 63 that becomes an LDD region is performed by implanting an impurity ion 64 only to the high voltage operation region A1, while the low voltage operation region A2 is covered with a first resist (not shown in FIG. 27). A second LDD implantation process for forming an impurity diffusion region 73 that becomes an LDD region is performed by implanting an impurity ion 74 only to the low voltage operation region A2, while the high voltage operation region A1 is covered with a second resist (not shown in FIG. 27).

Thus, the first and second LDD implantations are performed in different steps, and the impurity diffusion region 63 is usually formed so as to be deeper than the impurity diffusion region 73.

Referring to FIG. 28, an insulating layer (sidewall film) that becomes a lower layer sidewall or an upper layer sidewall is formed successively, followed by etch back. Thereby, in the high voltage operation region A1, a sidewall made up of an upper layer sidewall 65 and a lower layer sidewall 66 is formed on the side surface of the gate electrode 62. Also, in the low voltage operation region A2, a sidewall made up of an upper layer sidewall 75 and a lower layer sidewall 76 is formed on the side surface of the gate electrode 72.

Subsequently, in the high and low voltage operation regions A1 and A2, a source/drain region forming process is performed by implanting an impurity ion 55 from above, respectively. In this implantation, the gate electrode 62, upper layer sidewall 65 and lower layer sidewall 66 are used as a mask in the high voltage operation region A1, and the gate electrode 72, upper layer sidewall 75 and lower layer sidewall 76 are used as a mask in the low voltage operation region A2. Thereby, a source/drain region 67 and an LDD region 68 (an impurity diffusion region 63 underlying the sidewalls 65 and 66) are formed in the high voltage operation region A1, and a source/drain region 77 and an LDD region 78 (an impurity diffusion region 73 underlying the sidewalls 75 and 76) are formed in the low voltage operation region A2. Note that the LDD region is also called "extension region."

As a result, a MOS transistor Q11 for high voltage made up of the gate insulating film 61, gate electrode 62, upper layer sidewall 65, lower layer sidewall 66, source/drain region 67 and LDD region 68 is formed in the high voltage operation region A1, and a MOS transistor Q12 for low voltage made up of the gate insulating film 71, gate electrode 72, upper layer sidewall 75, lower layer sidewall 76, source/drain region 77 and LDD region 78 is formed in the low voltage operation region A2. As used herein, the term "MOS transistor for high voltage" means mainly a MOS transistor for input-output that operates at approximately 3.3 V, and the term "MOS transistor for low voltage" means mainly a MOS transistor for logic operation that operates at approximately 1.8 V.

FIG. 29 is a flowchart illustrating a procedure in the case when a semiconductor device of a CMOS structure is obtained by the conventional method as above described. The flowchart of FIG. 29 illustrates a sequence of steps taken after forming a gate insulating film and a gate electrode in each of high and low voltage operation regions A1 and A2.

In step S1, an LDD implantation process to a NMOS transistor for low voltage is performed. In step S2, an LDD implantation process to a PMOS transistor for low voltage is performed. In step S3, an LDD implantation process to a NMOS transistor for high voltage is performed. In step S4, an LDD implantation process to a PMOS transistor for high voltage is performed.

The order of steps S1 to S4 is changeable. A pocket implantation process for forming a pocket region may be added in steps S1 and S2, respectively.

In step S5, a pre-treatment using a wet process (including a wet etching and cleaning with a liquid) is performed. Example of the pre-treatment using the wet process is RCA cleaning. The term "RCA cleaning" means a process which comprises a treatment with $NH_4OH/H_2O_2$ (a process of removing particles) and a treatment with $HCl/H_2O_2$ (a process of removing metal contamination).

In step S6, a lower layer sidewall film is formed. In step S7, an upper layer sidewall film is formed, followed by a post-treatment, such as an etch back and a treatment with HF (hydrofluoric acid), so that a sidewall is formed on the side surface of the gate electrode of all MOS transistors.

In step S8, a source/drain region forming process is performed to all NMOS transistors (for high voltage and for low voltage). In step S9, a source/drain region forming process is performed to all PMOS transistors. The order of steps S8 and S9 is changeable.

Subsequently, silicide (salicide) such as $CoSi_2$ or $TiSi_2$ is formed on the surface of the source/drain regions and on the surface of the gate electrodes to complete all the MOS transistors.

With the conventional manufacturing method as described, the MOS transistor for high voltage and the MOS transistor for low voltage can be formed on one chip with a relatively few steps.

Between a MOS transistor Q111 for high voltage and a MOS transistor Q12 for low voltage in FIG. 28, there are three differences that the gate insulting film 61 has a larger thickness than the gate insulating film 71; the gate electrode 62 has a larger gate length than the gate electrode 72; and the LDD region 68 is formed so as to be deeper than the LDD region 78.

That is, the MOS transistor for high voltage differs from the MOS transistor for low voltage in three points that the gate insulating film for high voltage has a larger thickness than the gate insulating film for low voltage; that the gate electrode for high voltage has a larger gate length than the gate electrode for low voltage; and that the LDD region for high voltage is formed so as to be deeper than the LDD region for low voltage.

However, these three differences lead to a low freedom of design and it is thus difficult to optimize the operation characteristics of both the MOS transistor for high voltage and the MOS transistor for low voltage.

SUMMARY OF THE INVENTION

According to a first aspect of the invention, a semiconductor device containing first and second transistors of an insulating gate type formed in a semiconductor substrate, each of the first and second transistors comprising: a gate insulating film selectively disposed on the semiconductor substrate, the surface of the semiconductor substrate underlying the gate insulating film being defined as a channel region; a gate electrode disposed on the gate insulating film; a sidewall disposed adjacent to the side surface of the gate electrode; and a source/drain region disposed in the surface of the semiconductor substrate with the channel region interposed therebetween, is characterized in that the sidewall of the first transistor has a smaller forming width and a smaller forming height than the sidewall of the second transistor.

According to a second aspect of the invention, in the semiconductor device of the first aspect, the sidewalls of the first and second transistors have a lower layer sidewall disposed on the side surface of the gate electrode and on the surface of the semiconductor substrate, and have an upper layer sidewall disposed on the lower layer sidewall, a film thickness of the lower layer sidewall of the sidewall of the first transistor is smaller than a film thickness of the lower layer sidewall of the second transistor.

According to a third aspect of the invention, the semiconductor device of the second aspect is characterized in: that a recessed amount of the end portion of the lower layer sidewall from the end portion of the upper layer sidewall toward the gate electrode in the first transistor is larger than a recessed amount of the end portion of the lower layer sidewall from the end portion of the upper layer sidewall toward the gate electrode in the second transistor; and that a forming length of the source/drain region from the end portion of the sidewall to the gate electrode in the first transistor is larger than a forming length of the source/drain region from the end portion of the sidewall to the gate electrode in the second transistor.

According to a fourth aspect of the invention, the semiconductor device of the second aspect is characterized in: that the film thickness of the lower layer sidewall of the first transistor includes a first film thickness in the area adjacent to the side surface of the gate electrode and a second film thickness in the area on the surface of the semiconductor substrate; and that the first film thickness is smaller than the second film thickness or reduces to zero.

According to a fifth aspect of the invention, the semiconductor device of the first aspect is characterized in: that the sidewall wall of the second transistor has a lower layer sidewall disposed on the side surface of the gate electrode and on the surface of the semiconductor substrate, and has an upper layer sidewall disposed on the lower layer sidewall; and that the sidewall of the first transistor includes a sidewall, the shape of which is substantially the same as the upper layer sidewall of the second transistor.

According to a sixth aspect of the invention, the semiconductor device of the fifth aspect is characterized in that the sidewall of the first transistor has a thermal oxide film in its undermost layer.

According to a seventh aspect of the invention, the semiconductor device of the first aspect is characterized in that the semiconductor substrate includes a SOI substrate comprising a substrate, at least the surface of which is insulative, and a semiconductor layer disposed on the surface of the substrate.

According to an eighth aspect of the invention, the semiconductor device of the first aspect is characterized in that the conductivity type of the first and second transistors includes an N type.

According to a ninth aspect of the invention, the semiconductor device of the first aspect is characterized in that the conductivity type of the first and second transistors includes a P type.

According to a tenth aspect, a method of manufacturing a semiconductor device containing first and second transistors of an insulating gate type formed in a semiconductor substrate, comprises the steps of: (a) forming first and second gate insulating films in first and second regions on the semiconductor substrate, respectively, the surface of the semiconductor substrate under the first and second gate insulating films being defined as first and second channel regions, respectively; (b) forming first and second gate electrodes on the first and second gate insulating films, respectively; (c) forming a second impurity diffusion region by introducing impurity only to the second region by using the second gate electrode as a mask; (d) forming a lower layer sidewall film on the entire surface; (e) forming a first impurity diffusion region by introducing impurity only to the first region over the lower layer sidewall film by using the first gate electrode as a mask; (f) forming an upper layer sidewall film on the entire surface; (g) performing an etch back process to the upper layer sidewall film so that on the side surfaces of the first and second gate electrodes, first and second upper layer sidewalls are formed with the lower layer sidewall film interposed therebetween; (h) selectively removing the lower layer sidewall film to form first and second lower layer sidewalls on the side surfaces of the first and second gate electrodes and on the surface of the semiconductor substrate beneath the first and second upper layer sidewalls; and (i) forming a first source/drain region by introducing impurity by using the first upper layer and lower layer sidewalls and the first gate electrode as a mask, and forming a second source/drain region by introducing impurity by using the second upper layer and lower layer sidewalls and the second gate electrode as a mask, the first impurity diffusion region adjacent to the first source/drain region in the direction of the first gate electrode being defined as a first LDD region, the second impurity diffusion region adjacent to the second source/drain region in the direction of the second gate electrode being defined as a second LDD region, wherein the first transistor comprises the first gate insulating film, the first gate electrode, the first upper layer sidewall, the first lower layer sidewall, the first source/drain region and the first LDD region, and the second transistor comprises the second gate insulating film, the second gate electrode, the second upper layer sidewall, the second lower layer sidewall, the second source/drain region and the second LDD region.

According to an eleventh aspect of the invention, the method of the tenth aspect is characterized in: that the first transistor includes a NMOS transistor for high voltage; and that the second transistor includes a NMOS transistor for low voltage, a PMOS transistor for low voltage and a PMOS transistor for high voltage.

According to a twelfth aspect of the invention, the method of the tenth aspect is characterized in: the first transistor includes a NMOS transistor for high voltage and a PMOS transistor for high voltage; and that the second transistor includes a NMOS transistor for low voltage and a PMOS transistor for low voltage.

According to a thirteenth aspect of the invention, the method of the tenth aspect is characterized in: the first transistor includes a NMOS transistor for high voltage and a PMOS transistor for low voltage; and that the second transistor includes an NMOS transistor for low voltage and a PMOS transistor for high voltage.

According to a fourteenth aspect of the invention, the method of the tenth aspect is characterized in: that the first transistor includes a NMOS transistor for high voltage, a PMOS transistor for high voltage and a PMOS transistor for low voltage; and that the second transistor includes a NMOS transistor for low voltage.

According to a fifteenth aspect of the invention, the method of the tenth aspect further comprises the step of: (j) performing, before the step (d), a RTA (rapid thermal annealing) process.

According to a sixteenth aspect of the invention, the method of the tenth aspect is characterized in that the step (d) includes the step of forming the lower layer sidewall film by using TEOS as a material.

According to a seventeenth aspect of the invention, the method of the tenth aspect is characterized in the step (d) includes the step of forming the lower layer sidewall film by using a high temperature CVD thermal film as a material.

According to an eighteenth aspect of the invention, the method of the tenth aspect further comprises the step of: (k) performing, between the steps (e) and (f), a pretreatment with a wet process.

According to a nineteenth aspect of the invention, the method of the eighteenth aspect is characterized in that the step (h) includes the step of removing the lower layer sidewall film by a wet etching.

According to a twentieth aspect of the invention, the method of the tenth aspect is characterized in that the step (e) includes the step of introducing nitrogen into the first impurity diffusion region.

In the semiconductor device of the first aspect, the sidewall of the first transistor is formed so as to have a smaller forming width and a smaller forming height than the sidewall of the second transistor. This enables to obtain the first transistor having a high driving capability than the second transistor, and the second transistor having a low parasitic capacity than the first transistor.

Therefore, the use of the first transistor for high voltage operation and the use of the second transistor for low voltage operation enable to provide a semiconductor device that optimizes the operation characteristics of both an insulating gate type transistor for high voltage and an insulating gate type transistor for low voltage.

In the semiconductor device of the second aspect, between the sidewalls of the first and second transistors, the forming width and forming height can be changed relatively easily by reducing the thickness of the lower layer sidewall of the sidewall of the first transistor than the thickness of the lower layer sidewall of the sidewall of the second transistor.

With the semiconductor device structure of the third aspect, a further improvement in driving capability of the first transistor is attainable by reducing the effective channel length of the channel region.

In the semiconductor device of the fourth aspect, the driving capability of the first transistor can be increased because the influence of field formed by the gate electrode of the first transistor can be given strongly to the source/drain region underlying the sidewall, by making the first film thickness smaller than the second film thickness to further reduce the forming width of the sidewall of the first transistor.

In the semiconductor device of the fifth aspect, the driving capability of the first transistor can be increased because the influence of field formed by the gate electrode of the first transistor can be given strongly to the source/drain region underlying the sidewall, by arranging so that the forming width of the sidewall of the first transistor is narrower than the forming width of the second sidewall by the amount of the lower layer sidewall.

In the semiconductor device of the sixth aspect, the driving capability of the first transistor can be increased because the influence of field formed by the gate electrode of the first transistor can be given strongly to the source/ drain region underlying the sidewall, by arranging so that the forming width of the sidewall of the first transistor is narrower than the forming width of the second sidewall by the amount of absence of a lower layer sidewall in the direction of the forming width.

With the seventh aspect, a semiconductor device that optimizes the operation characteristics of both an insulating gate type transistor for high voltage and an insulting gate type transistor for low voltage can be obtained even on a SOI substrate.

With the semiconductor device of the eighth aspect, it is able to use the first or second transistor as the occasion demands in an insulating gate type transistor of which conductivity type is N type.

With the semiconductor device of the ninth aspect, it is able to use the first or second transistor as the occasion demands in an insulating gate type transistor of which conductivity type is P type.

With the method of the tenth aspect, the resistance to hot carrier of the first transistor can be increased by the amount that the formation of a trap state on the semiconductor substrate surface is suppressed, because in the step (e) the first impurity diffusion region is formed only in the first region by introducing impurity over the lower layer sidewall film by using the first gate electrode as a mask.

In addition, since the impurity is introduced over the lower layer sidewall film, at the same implantation energy, the first impurity diffusion region to be an LDD region can be formed so as to be relatively shallow, as compared to the case of directly introducing impurity. It is therefore able to obtain a good short channel characteristic whereby it is unsusceptible to short channel effect.

With the method of the tenth aspect, the number of steps can be minimized because the steps other than the steps (e) and (c) for forming the first and second impurity diffusion regions are commonly executable between the first and second transistors.

With the method of the eleventh aspect, it is able to obtain a NMOS transistor for high voltage with an improved resistance to hot carrier.

With the method of the twelfth aspect, it is able to obtain NMOS and PMOS transistors for high voltage with an improved resistance to hot carrier.

With the method of the thirteenth aspect, it is able to obtain a NMOS transistor for high voltage with an improved resistance to hot carrier, and a PMOS transistor for low voltage with an improved short channel characteristic.

With the method of the fourteenth aspect, it is able to obtain NMOS and PMOS transistors for high voltage with an improved resistance to hot carrier, and a PMOS transistor for low voltage with an improved short channel characteristic.

With the method of the fifteenth aspect, TED (transient enhanced diffusion) phenomenon that occurs in the step (d) can be suppressed effectively by performing a RTA process in the step (j) before the step (d) for forming the lower layer sidewall film.

With the method of the sixteenth aspect, the trap state at the interface between the lower layer sidewall film and the semiconductor substrate can be further reduced by that in the step (d) the lower layer sidewall film is formed by using TEOS as a material.

With the method of the seventeenth aspect, the trap state at the interface between the lower layer sidewall film and the semiconductor substrate can be further reduced by that in the step (d) the lower layer sidewall film is formed by using a high temperature thermal CVD oxide film as a material.

With the method of the eighteenth aspect, the first region has a smaller film thickness than the second region in the lower layer sidewall film because the film thickness of the first region of the lower layer sidewall film into which the impurity is introduced in the step (e), is reduced due to the pre-treatment with a wet process in the step (k).

As a result, the sidewall of the first transistor (the first upper and lower layer sidewalls) has a smaller forming width and a smaller forming height than the sidewall of the second transistor (the second upper and lower layer sidewalls). Therefore, the first transistor has a higher driving capability than the second transistor, and the second transistor has a lower parasitic capacity than the first transistor.

With the method of the nineteenth aspect, the lower layer sidewall film can be etched in the area extending from the end portion of the first and second upper layer sidewalls to the first and second gate electrodes, respectively, because in the step (h) the lower sidewall film is removed by a wet etching.

Therefore, by utilizing the fact that the film thickness of the first region is smaller than that of the second region in the lower layer sidewall film, the recessed amount of the end portion of the first lower layer sidewall from the end portion of the first upper layer sidewall toward the first gate electrode can be increased than the recessed amount of the end portion of the second lower layer sidewall from the end portion of the second upper layer sidewall toward the second gate electrode.

As a result, in the first and second source/drain regions formed in the step (i), the forming length from the end portion of the first sidewall of the first source/drain region to the first gate electrode is larger than the forming length of the second source/drain region from the end portion of the second sidewall to the second gate electrode. Therefore, the first transistor with a further improved driving capability can be obtained by further reducing the effective channel length of the channel region.

With the method of the twentieth aspect, the trap state at the interface with the semiconductor substrate beneath the lower layer sidewall can be further reduced by introducing nitrogen into the first impurity diffusion region in the step (e).

It is an object of the present invention to overcome the foregoing drawbacks by providing a semiconductor device that optimizes the operation characteristics such as of both an insulating gate type transistor for high voltage and an insulating gate type transistor for low voltage, as well as a method of manufacturing the same.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 12 are sectional views illustrating a sequence of steps in a method of manufacturing a semiconductor device according to a first preferred embodiment of the present invention;

FIG. 18 is a flowchart illustrating a method of manufacturing a semiconductor device according to a second preferred embodiment;

DESCRIPTION OF THE PREFERRED EMBODIMENTS

First Preferred Embodiment FIGS. 1 to 10 are sectional views illustrating a sequence of steps in a method of manufacturing a semiconductor device containing a MOS transistor for high voltage and a MOS transistor for low voltage, according to a first preferred embodiment of the invention. The method of the first preferred embodiment will be described hereinafter by referring to these figures.

Figure 1:
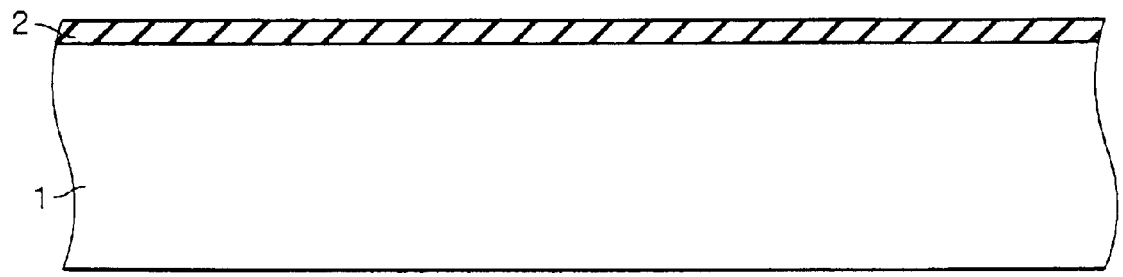

Referring to FIG. 1, an insulating film 2 having a relatively large thickness is formed on a semiconductor substrate 1 such as a silicon substrate.

Figure 2:
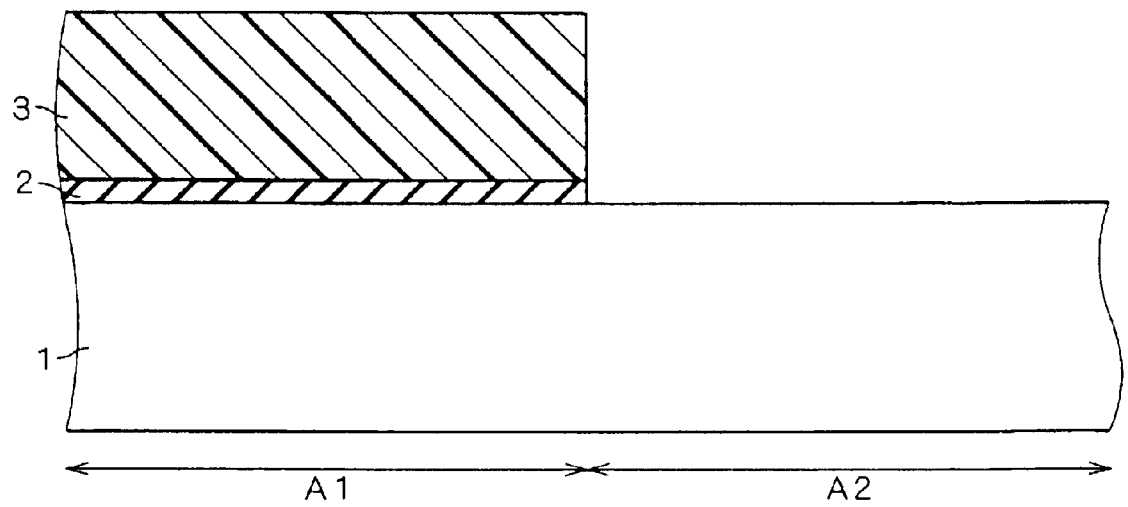

Referring to FIG. 2, a patterned resist 3 is formed so as to cover the surface of a high voltage operation region A1. By using the resist 3 as a mask, an etching process to the insulating film 2 is performed to remove the insulating film 2 formed on a low voltage operation region A2.

Figure 3:
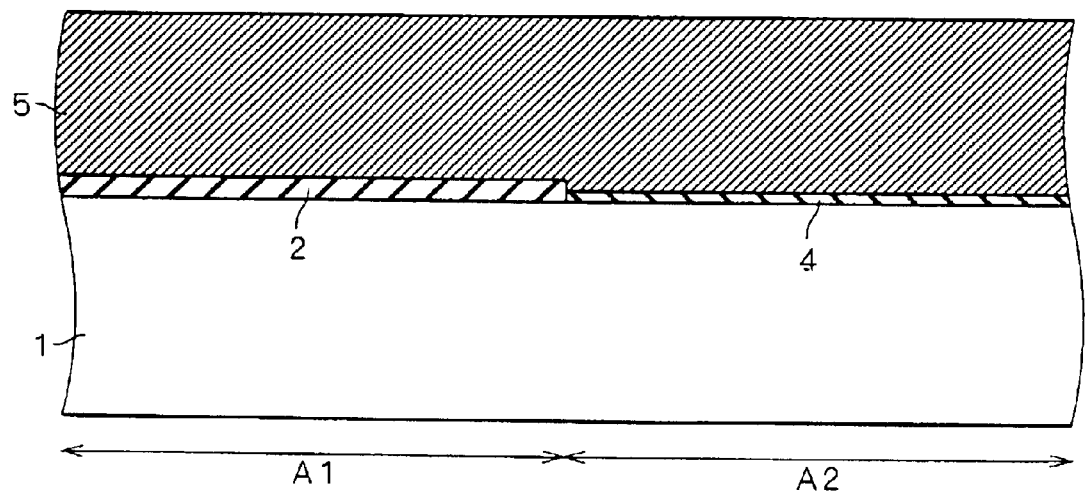

Referring to FIG. 3, the resist 3 is then removed and an insulating film having a relatively small thickness is formed on the entire surface. Thereby, an insulating film 4 is formed in the low voltage operation region A2, and the thickness of the insulating film 2 in the high voltage operation region A1 is slightly increased. Subsequently, a conductive layer 5 is deposited on the entire surface.

Figure 4:
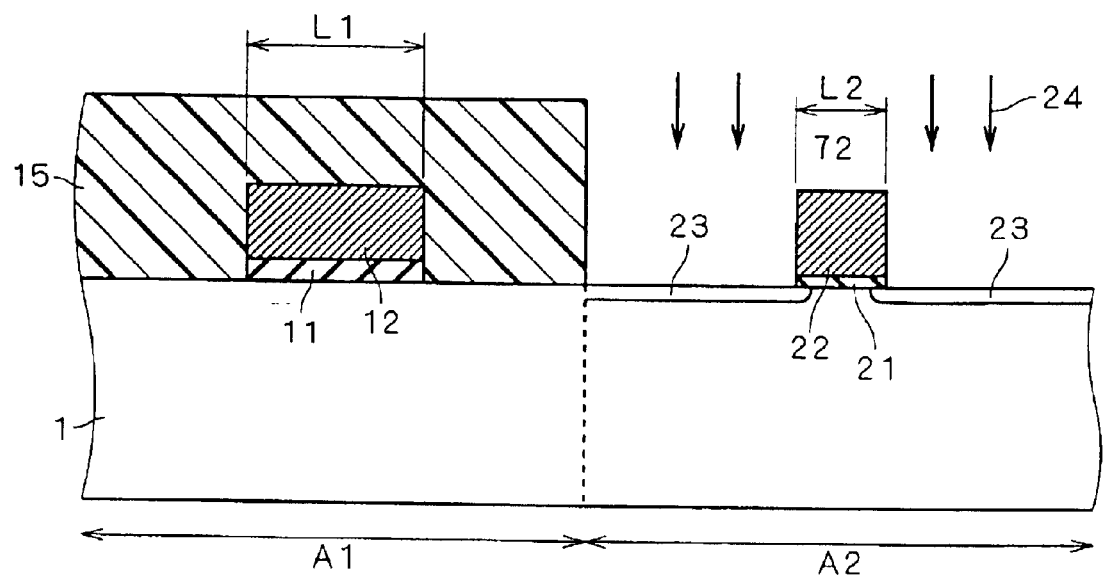

Referring to FIG. 4, the conductive layer 5 is selectively etched so that a gate insulating film 11 and a gate electrode 12 are formed in the high voltage operation region A1, and a gate insulating film 21 and a gate electrode 22 are formed in the low voltage operation region A2 at the same time. In this case, the gate insulating film 11 is formed so as to have a larger thickness than the gate insulating film 21, and the gate electrode 12 is formed so as to have a gate length L1 that is larger than a gate length L2 of the gate electrode 22. The gate lengths L1 and L2 are, for example, 0.4 μm and 0.18 μm, respectively. The surface of the semiconductor substrate 1 underlying the gate insluting film 11 and that underlying the gate insulating film 21 become a channel region of a MOS transistor for high voltage and a MOS transistor for low voltage, respectively.

Referring again to FIG. 4, a patterned resist 15 is formed so as to cover the high voltage operation region A1. By using the resist 15 as a mask, a first LDD implantation process of implanting an impurity ion 24 is performed so that an impurity diffusion region 23 that becomes an LDD region is formed so as to be relatively shallow in the surface of the semiconductor substrate 1 in the low voyage operation region A2. Although not shown in FIG. 4, the insulating films 2 and 4 which are formed on the entire surface of the semiconductor substrate 1 for the use of the gate insulating films 111 and 21, remain in a small thickness even after etching the gate electrodes 12 and 22. This results in that a thermal oxide film is present in a small thickness.

As an example of the implantation process of the impurity ion 24, the following case can be considered for NMOS transistors. With arsenic ion, its implantation is conducted at an energy of 3 to 20 keV, a dose of $1 \times 10^{14}$ to $1 \times 10^{15}/cm^2$, and an angle of 0°.

In forming a pocket region (not shown in FIG. 4) of the NMOS transistor, an ion implantation using boron ion is conducted at an energy of 10 to 20 keV, a dose of $1 \times 10^{13}$ to $3 \times 10^{13}/cm^2$, and an angle of 0 to 45°.

As an example of the implantation process of the impurity ion 24, the following case can be considered for PMOS transistors. With $BF_2$ ion, its implantation is conducted at an energy of 3 to 20 keV, a dose of $1 \times 10^{14}$ to $1 \times 10^{15}/cm^2$, and an angle of 0°.

In forming a pocket region (not shown in FIG. 4) of the PMOS transistor, an ion implantation using arsenic ion is conducted at an energy of 50 to 150 keV, a dose of $1 \times 10^{13}$ to $3 \times 10^{13}/cm^2$, and an angle of 0 to 45°.

Figure 5:
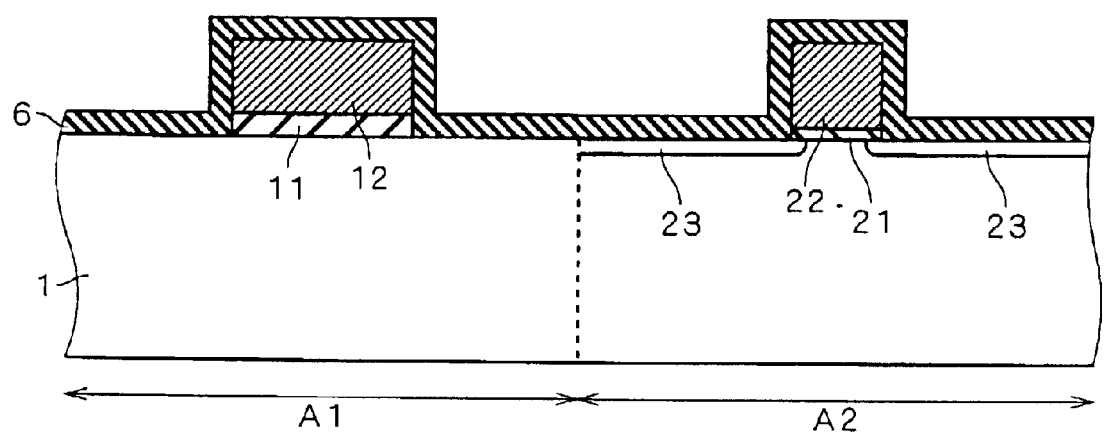

Referring to FIG. 5, the resist 15 is then removed, and a silicon oxide film 6 that is a lower layer sidewall film is deposited on the entire surface. As a silicon oxide film 6, it can be considered to use TEOS (tetra ethoxy silane: $Si(OC_2H_5)_4$) or HTO (high temperature oxide, namely, a high temperature thermal CVD oxide film) with a thickness of approximately 10 nm.

Figure 6:
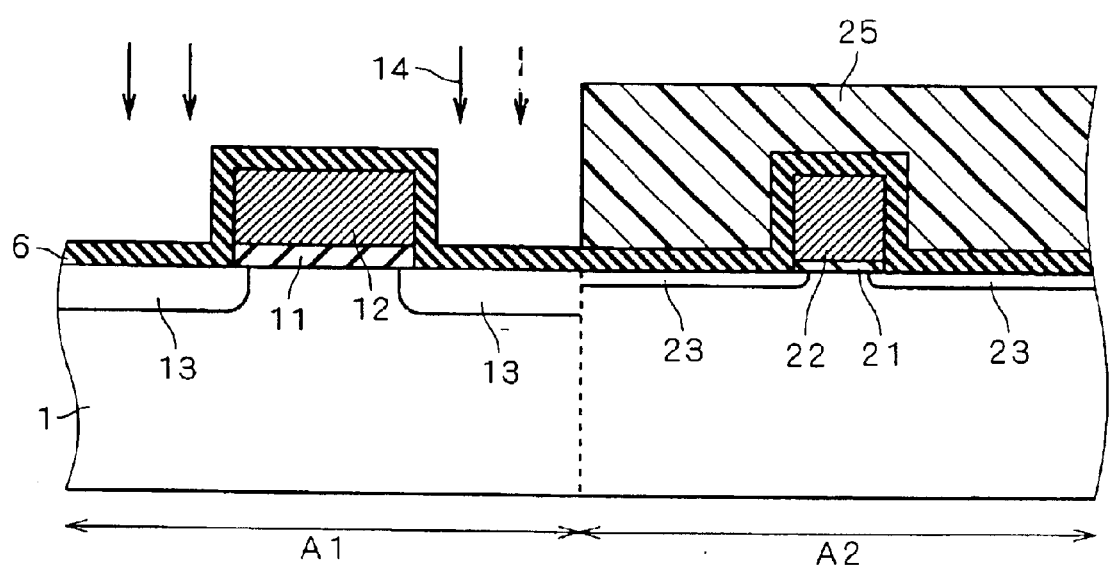

Referring to FIG. 6, a patterned resist 25 is formed so as to cover the low voltage operation region A2. By using the resist 25 as a mask, a second LDD implantation process of implanting an impurity ion 14 is performed so that an impurity diffusion region 13 that becomes an LDD region is formed so as to be relatively deep in the surface of the semiconductor substrate 1 in the high voltage operation region A1. Therefore, the forming depth of the impurity diffusion region 13 is larger than that of the impurity diffusion region 23.

As an example of the implantation process of the impurity ion 14, the following case can be considered for NMOS transistors. With arsenic ion, its implantation is conducted at an energy of 100 to 200 keV, a dose of $1 \times 10^{13}$ to $4 \times 10^{13}/cm^2$, and an angle of 0 to 60°.

For the purpose of relaxing the field in the drain region, an ion implantation using phosphorus ion is conducted at an energy of 30 to 100 keV, a dose of $5 \times 10^{12}$ to $2 \times 10^{13}/cm^2$, and an angle of 0 to 60°.

Further, nitrogen may be added to this implantation. The addition of nitrogen enables to reduce the trap state at the interface between the semiconductor substrate 1 and lower layer sidewall film. Specifically, nitrogen ion is implanted at an energy of 5 to 20 keV, a dose of $1\times10^{15}$ to $1\times10^{16}/cm^2$, and an angle of 0 to 30°.

As an example of the implantation process of the impurity ion 14, the following case can be considered for PMOS transistors. With $BF_2$ ion, its implantation is conducted at an energy of 10 to 50 keV, a dose of $1\times10^{14}$ to $1\times10^{15}/cm^2$, and an angle of 0 to 45°.

Thus, the second LDD implantation process in the high voltage operation region A1 is conducted over the silicon oxide film 6. Therefore, the thermal oxide film itself that remains on the surface of the semiconductor substrate 1 in the formation of the gate insulating film 11 is not directly exposed to the impurity ion 14 in the second LDD implantation process. Thereby, the formation of a trap state in the surface of the semiconductor substrate 1 is suppressed to improve resistance to hot carrier.

After the step of FIG. 6, the resulting construction is such that the silicon oxide film 6 in the high voltage operation region A1 contain the impurity during the second LDD implantation process whereas the silicon oxide film 6 in the low voltage operation region A2 contains no impurity.

The resist 25 is then removed, followed by a pre-treatment with a wet process. By the pre-treatment, the silicon oxide film 6 containing the impurity in the high voltage operation region A1 is reduced in thickness, and the silicon oxide film 6 containing no impurity in the low voltage operation region A2 is not reduced in thickness. This is because in the pre-treatment with the wet process, a film doped with the impurity is usually etched at a high etching rate.

Figure 7:
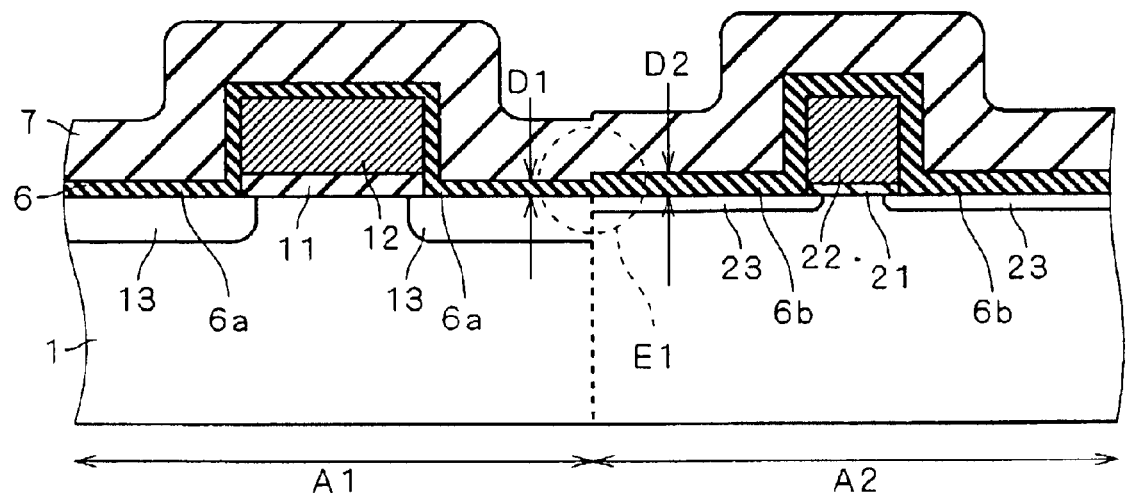

Therefore, thickness D1 of the silicon oxide film 6a in the high voltage operation region A1 is smaller than thickness D2 of the silicon oxide film 6b in the low voltage operation region A2 by the amount of the thickness reduction as above described (see region E1 in FIG. 7).

Referring to FIG. 7, a silicon nitride film 7 that is an upper layer sidewall film constituting a sidewall body is deposited on the entire surface. The silicon nitride film 7 preferably has a thickness of about 50 nm.

Figure 8:
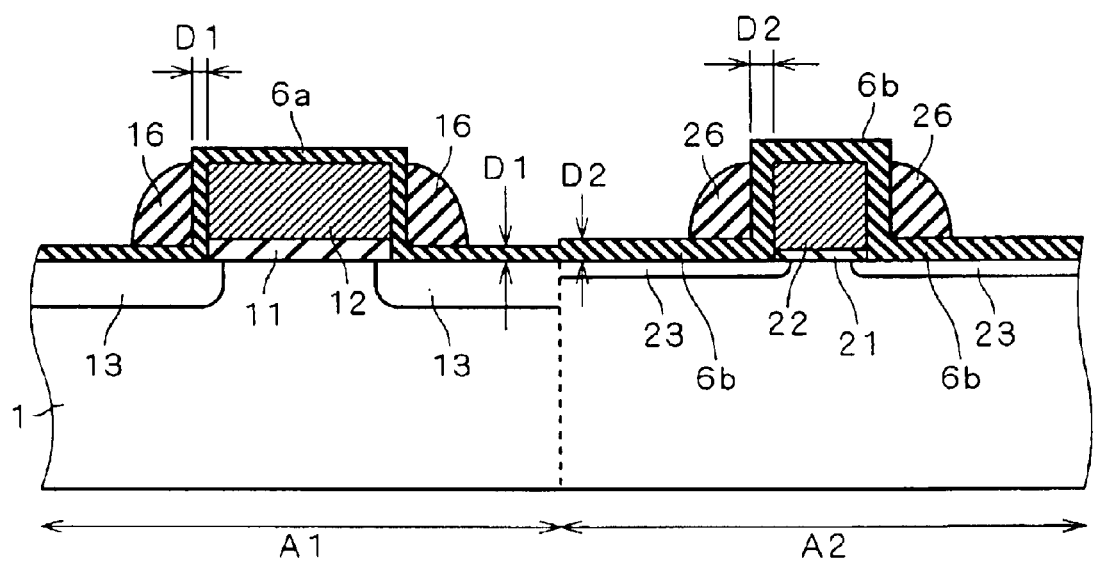

Referring to FIG. 8, by performing an etch back process to the entire surface of the semiconductor substrate 1, an upper layer sidewall 16 is formed in the high voltage operation region A1 and an upper layer sidewall 26 is formed in the low voltage operation region A2.

Figure 9:
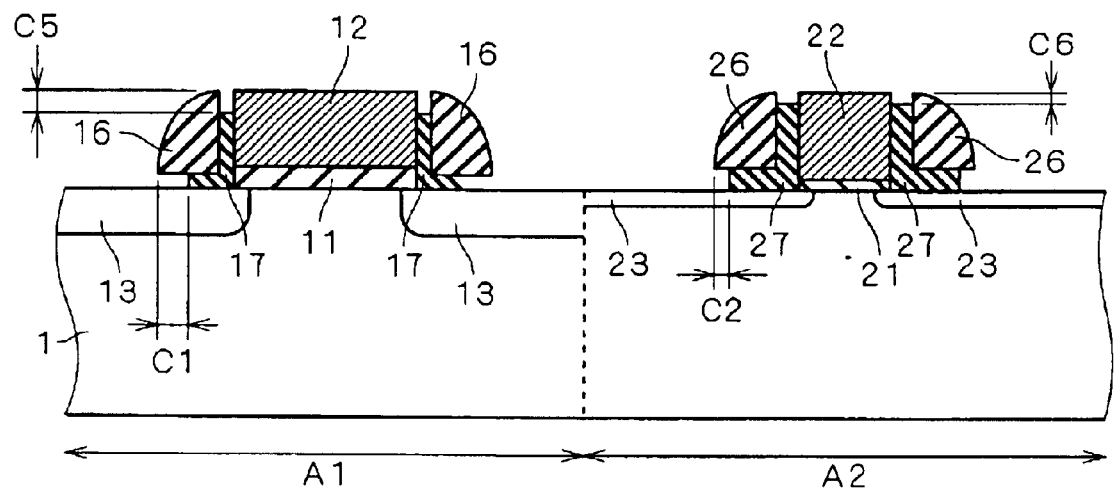

Referring to FIG. 9, a wet etching is performed to remove the unnecessary portions of the silicon oxide films 6a and 6b, so that a lower layer sidewall 17 is formed in the high voltage operation region A1, and a lower layer sidewall 27 is formed in the low voltage operation region A2. This results in a sidewall for a MOS transistor for high voltage made up of the upper layer sidewall 16 and lower layer sidewall 17, and a sidewall for a MOS transistor for low voltage made up of the upper layer sidewall 26 and lower layer sidewall 27.

The lower layer sidewall 17 is formed on part of the impurity diffusion region 13 and on the side surface of the gate electrode 12. The upper layer sidewall 16 is formed on the upper layer sidewall 17. The sidewall 27 is formed on part of the impurity diffusion region 23 and on the side surface of the gate electrode 22. The upper layer sidewall 26 is formed on the upper layer sidewall 27.

In the wet etching, an HF solution is used to the silicon oxide film 6 containing such as a TEOS oxide film and HTO film.

By the wet etching to the silicon oxide film 6 (6a, 6b), the silicon oxide film 6 is also etched away in the area extending from the end portions of the side surfaces of the upper layer sidewalls 16 and 26 to the gate electrodes 12 and 22.

At this time, since the silicon oxide film 6a has a smaller thickness than the silicon oxide film 6b, a recessed amount C1 of the silicon oxide film 6a in the direction from the end portion of the side surface of the upper layer sidewall 16 to the gate electrode 12 is greater than a recessed amount C2 of the silicon oxide film 6b in the direction from the end portion of the side surface of the upper layer sidewall 26 to the gate electrode 22. Also, a recessed amount C5 of the silicon oxide film 6a from the uppermost part of the upper layer sidewall 16 to a downward thereof is greater than a recessed amount C6 of the silicon oxide film 6b from the uppermost part of the upper layer sidewall 26 to a downward thereof.

Figure 10:
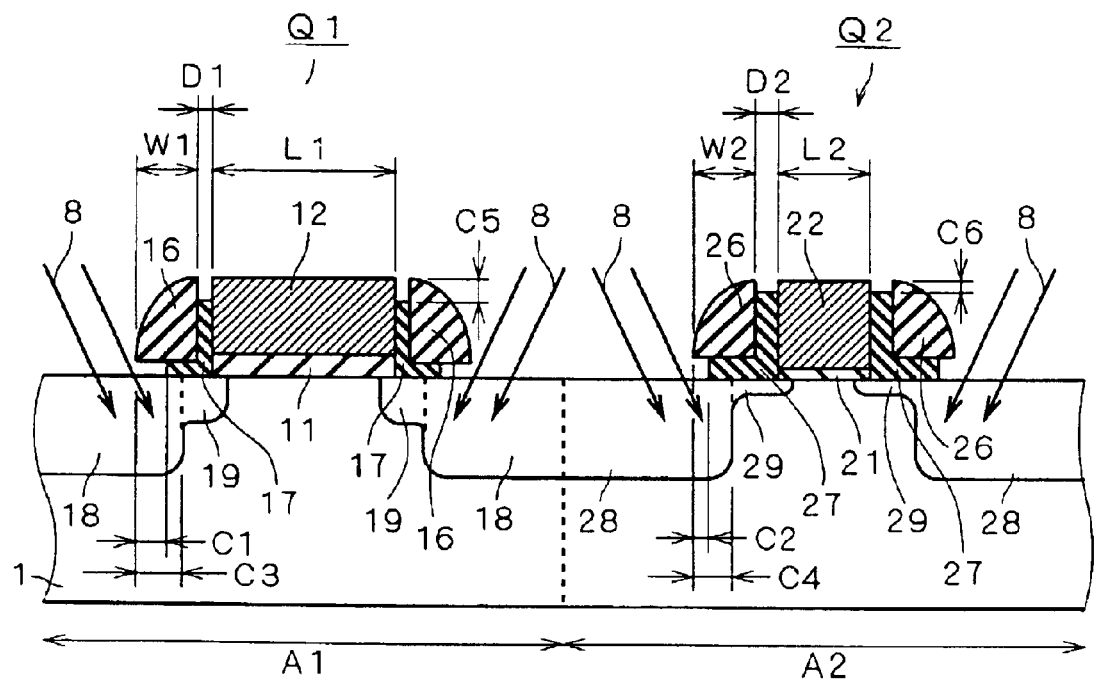

Referring to FIG. 10, a source/drain region forming process in which an impurity ion 8 is commonly implanted to all MOS transistors of the same conductivity type is performed, so that a source/drain region 18 and an LDD region 19 (i.e., an impurity diffusion region 13 into which no impurity ion 8 is implanted) are formed in the high voltage operation region A1, and a source/drain region 28 and an LDD region 29 (i.e., an impurity diffusion region 23 into which no impurity ion 8 is implanted) are formed in the low voltage operation region A2. Specifically, the source/drain regions 18 and 28 are disposed with the channel regions of the MOS transistor for high voltage and the MOS transistor for low voltage interposed therebetween, respectively.

The impurity ion 8 is implanted by an oblique implantation, as shown in FIG. 10, and also utilizing the fact that the recessed amount C1 is larger than the recessed amount C2. Thereby, the recessed amount C3 of the source/drain region 18 toward the gate electrode 12 in the high voltage operation region A1 can be made larger than the recessed amount C4 of the source/drain region 28 toward the gate electrode 22 in the low voltage operation region A2.

FIG. 11 is an explanatory diagram of the case that the impurity ion 8 is implanted at an angle of zero. As shown in FIG. 11, even when the impurity ion 8 is conducted at an angle of zero, instead of an oblique implantation, a clearance 9 beneath the upper layer sidewall 16 has no function of blocking the impurity ion 8. Therefore, the recessed amount C3 of the source/drain region 18 is larger than the recessed amount C4 of the source/drain region 28 by the amount that the clearance 9 of the high voltage operation region A1 is larger than that of the low voltage operation region A2 (i.e., C1>C2).

As an example of the implantation process of the impurity ion 8, the following case can be considered for NMOS transistors. With arsenic ion, its implantation is conducted at an energy of 20 to 70 keV, a dose of $1\times10^{15}$ to $1\times10^{16}/cm^2$, and an angle of 0 to 30°.

Further, in order to reduce the leakage from a junction part between the source/drain region 18 (28) and the semiconductor substrate 1, which is caused by the silicide region formation, an ion implantation using phosphorus ion is conducted at an energy of 10 to 50 keV, a dose of $5\times10^{12}$ to $4\times10^{13}/cm^2$, and an angle of 0 to 30°.

As an example of the implantation process of the impurity ion 8, in the case of PMOS transistors, an ion implantation using $BF_2$ ion is conducted at an energy of 10 to 30 keV, a dose of $1\times10^{15}$ to $1\times10^{16}/cm^2$, and an angle of 0 to 30°.

Further, in order to reduce the leakage from a junction part between the source/drain region 18 (28) and the semiconductor substrate 1, which is caused by the silicide region formation, an ion implantation using boron ion is conducted at an energy of 10 to 50 keV, a dose of $5 \times 10^{12}$ to $4 \times 10^{13}$/cm$^2$, and an angle of 0 to 30°.

Referring to FIG. 12, a silicide process is then performed so that silicide regions 31 and 41 are formed on the surface of the source/drain regions 18 and 28, respectively, and silicide layers 32 and 42 are formed on the surface of the gate electrodes 12 and 22, respectively.

In FIG. 12, the suicide is formed both the low and high voltage parts. Alternatively, there is such a structure that particularly in the I/O part of the high voltage part, no silicide is disposed to improve resistance to ESD (electro static discharge). This structure can be obtained in the following manner that only a desired high voltage part is covered with an oxide film etc., and a silicide process is then performed. Examples of silicide are $CoSi_2$, $TiSi_2$ and $NiSi_2$.

Through the foregoing steps, a MOS transistor Q1 for high voltage and a MOS transistor Q2 for low voltage are completed in the high voltage operation region A1 and the low voltage operation region A2, respectively. That is, when the impurity ions 8, 14 and 24 are of N type, the NMOS transistor for high voltage and the NMOS transistor for low voltage are completed as the MOS transistor Q1 for high voltage and the MOS transistor Q2 for low voltage, respectively. When the impurity ions 8, 14 and 24 are of P type, the PMOS transistor for high voltage and the PMOS transistor for low voltage are completed as the MOS transistor Q1 for high voltage and the MOS transistor Q2 for low voltage, respectively.

Figure 13:
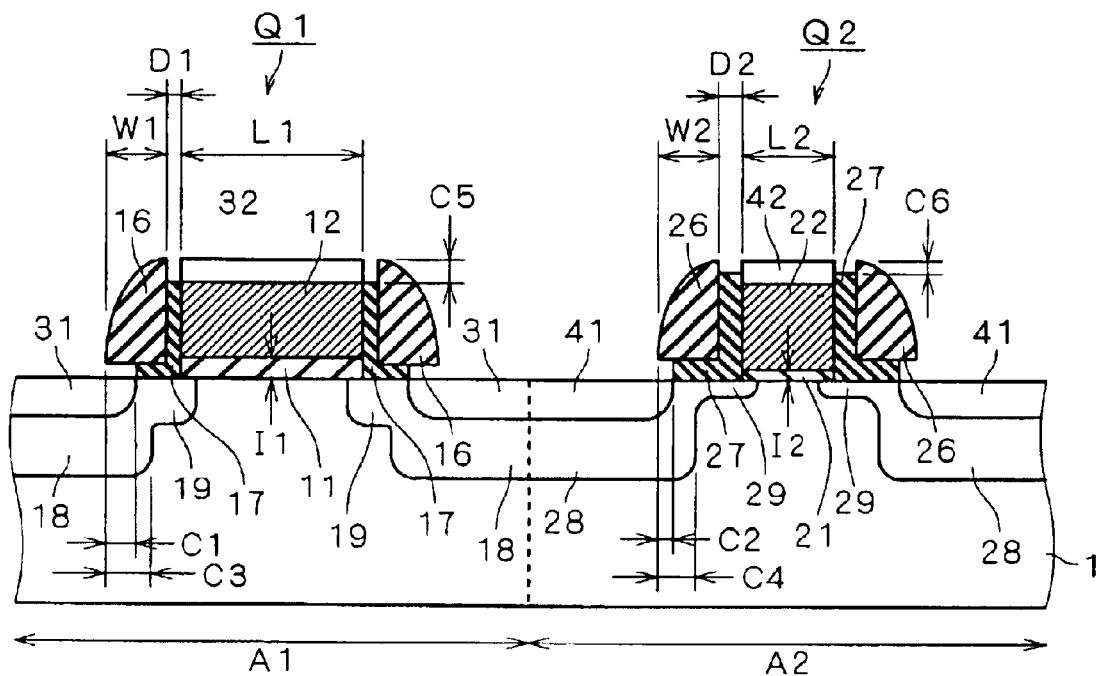
FIG. 13 is a sectional view illustrating the structure of a semiconductor device manufactured with the method of the first preferred embodiment.

FIG. 13 is a sectional view illustrating a structure of a semiconductor device manufactured with the method of the first preferred embodiment. Between the MOS transistor Q1 for high voltage and the MOS transistor Q2 for low voltage, a comparison of the size of components is made by referring to FIG. 13.

Between thickness 11 of the gate insulating film 11 and thickness 12 of the gate insulating film 21, the following relationship holds: I1>I2. Between width WI of the upper layer sidewall 16 and width W2 of the upper layer sidewall 26, the following relationship holds: W1=W2. Between thickness D1 of the lower layer sidewall 17 and thickness D2 of the lower layer sidewall 27, the following relationship holds: D1<D2. Between a gate length L1 of the gate electrode 12 and a gate length L2 of the gate electrode 22, the following relationship holds: L1>L2. Between a recessed amount C1 of the lower layer sidewall 17 and a recessed amount C2 of the lower layer sidewall 27, the following relationship holds: C1>C2. Between a recessed amount C3 of the source/drain region 18 and a recessed amount C4 of the source/drain region 28, the following relationship holds: C3>C4.

Thus, by realizing the structure that satisfies the relationship: the recessed amount C1>the recessed amount C2 (C3>C4), the driving capability can be improved by the amount that the series resistance between the source/drain regions 18 and 18 in the high voltage operation region A1 is lowered than the series resistance between the source/drain regions 28 and 28 in the low voltage operation region A2.

On the other hand, by minimizing the recessed amount C2 in the low voltage operation region A2, the distance between the source/drain regions 28 and 28 can be substantially set to (L2+2·W2+2·D2). This provides a good short channel characteristic whereby it is unsusceptible to short channel effect.

Figure 14:
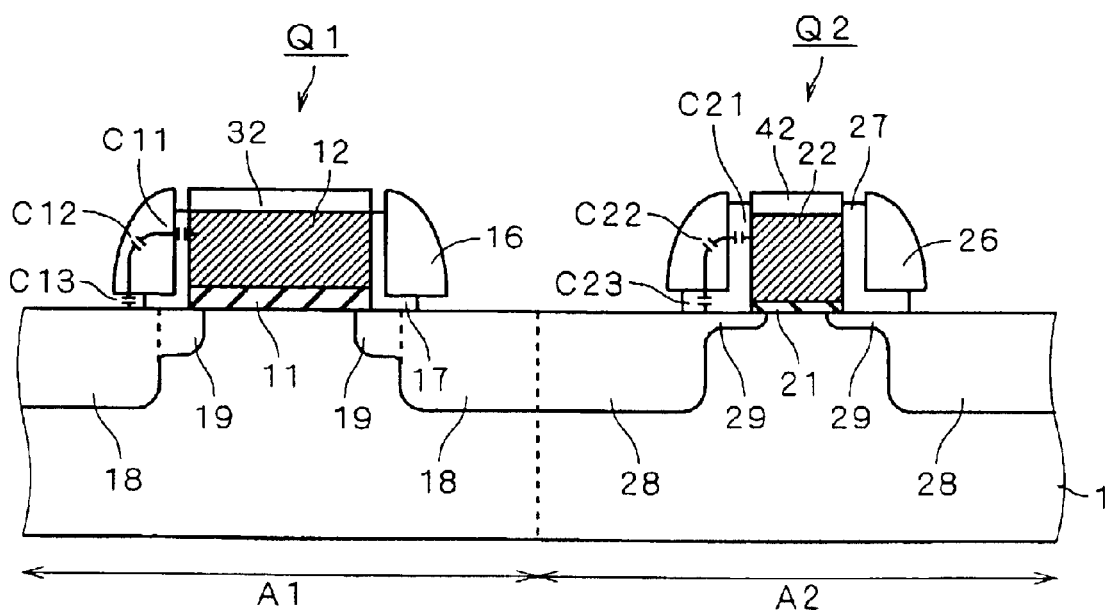
FIG. 14 is an explanatory diagram of a parasitic capacity component between a gate electrode and source/drain region of a MOS transistor in the first preferred embodiment.

FIG. 14 is an explanatory diagram of a parasitic capacity component between the gate electrode and source/drain region of the MOS transistor of the semiconductor device in the first preferred embodiment.

Referring to FIG. 14, a comparison is made between parasitic capacitors C11 to C13 of the MOS transistor Q1 for high voltage and parasitic capacitors C21 to C23 of the MOS transistor Q2 for low voltage. Because of the relationship: thickness D1<thickness D2, a comparison of capacity results in that: C11>C21, and C13>C23. Also, because of W1=W2, the following relationship holds: C12=C22. Accordingly, the parasitic capacity of the MOS transistor Q2 for low voltage can be minimized than that of the MOS transistor Q1 for high voltage. In a semiconductor device (LSI) in which a MOS transistor for high voltage and a MOS transistor for low voltage are provided to respond to a variety of voltages, the MOS transistor Q2 for low voltage is usually suitable for reducing its parasitic capacity to achieve high speed because it handles an inner high speed logic part.

On the other hand, since a thin gate insulating film is used in the high speed logic part, it is impossible to realize a circuit requiring a high voltage, such as a control circuit for interface with a high voltage used on a board, e.g., a printed wiring board, and a control circuit for flash memory.

For instance, in a high voltage I/O circuit requiring such a high voltage, it is necessary to drive an external large capacity and to improve firstly the driving capability of the transistor itself. Therefore, an increase in parasitic capacity is insignificant by designing such that resistance to hot carrier satisfies a predetermined reference.

Hereinafter, the resulting effect of the semiconductor device of the first preferred embodiment will be described by referring to FIG. 13.

(I) MOS transistors of the same conductivity type can be made with little or no increase in the number of steps than has hitherto been desired. This is because, between the high voltage operation region A1 and low voltage operation region A2, the LDD implantation is performed in different steps, the formation of sidewalls by means of etch back is performed at the same time, and the source/drain region forming process is performed at the same time.

(II) The resistance to hot carrier of the MOS transistor Q1 for high voltage is considerably improved because the LDD implantation process of the high voltage operation region A1 is performed after forming the silicon oxide film 6 for forming the lower layer sidewall, that is, an ion implantation is performed over the silicon oxide film 6, thereby little or no trap state is formed on the surface of the semiconductor substrate 1.

(III) When an impurity ion implantation is performed over the silicon oxide film 6 as described in the above (II), there remains a fear that an impurity implantation loss occurs to degrade the driving capability of the MOS transistor Q1 for high voltage. However, such a fear can be substantially eliminated because only the silicon oxide film 6a in the high voltage operation region A1 can be formed in a thin film by performing a pre-treatment with a wet process before depositing the silicon nitride film 7 that is an upper layer sidewall film.

(IV) In respect of above (III), since the impurity ion is directly implanted to the low voltage operation region A2 (in fact, via a thermal oxide film that remains in forming the gate insulating film 21), no problem occurs even if the implantation energy is low. Therefore, the impurity diffusion region 23 (LDD region 29) can be formed in a relatively shallow region from the surface of the semiconductor substrate 1, thereby causing no degradation of short channel characteristic (resistance to punch-through).

(V) The driving capability of the MOS transistor Q1 for high voltage can be increased because the source/drain region 18 is formed in a more proximity to the gate electrode 12, by arranging so that when removing the silicon oxide film 6a for a lower layer sidewall, the recessed amount C1 of the lower layer sidewall 17 of the high voltage operation region A1 is increased than the recessed amount C2 of the lower layer sidewall 27 of the low voltage operation region A2. Similarly, the driving capability of the MOS transistor Q1 for high voltage can be increased by forming the silicide region 31 in the vicinity of the edge of the gate electrode 12.

(VI) In respect of the above (V), the recessed amount C2 of the low voltage operation region A2 can be made relatively small, and the source/drain regions 28 and 28 can be spaced a sufficient distance, thereby causing no degradation of short channel characteristic.

(VII) The driving capability of the MOS transistor Q1 for high voltage is improved because the influence of field formed by the gate electrode 12 can be given strongly to the LDD region 19 underlying the sidewalls 16 and 17, by forming the lower layer sidewall 17 of the MOS transistor Q1 for high voltage so as to have a relatively small thickness D1.

(VIII) In respect of the above (VII), by forming the lower layer sidewall 27 of the MOS transistor Q2 for low voltage so as to have a relatively large thickness D2, the parasitic capacity between the gate electrode and source/drain region can be reduced to realize high speed operation at a low power consumption.

(IX) In the low voltage operation region A2, a sharp profile (i.e., a rapid change in concentration) can be obtained with an impurity ion implantation at a low energy, by performing an LDD implantation process before forming the silicon oxide film 6. Since the impurity diffusion region 23 can be formed by effectively using such a sharp profile, it is able to obtain the MOS transistor Q2 for low voltage that resists short channel effect and has a high driving capability.

(X) In respect of the above (IX), by effectively using the impurity ion implantation over the silicon oxide film 6 in the high voltage operation region A1, an ion implantation process at a high energy and an ion implantation process over the silicon oxide film 6 are suitably combined to make the impurity profile broad. Thereby, the field concentration occurred at the end portion of the drain region can be relaxed to improve resistance to hot carrier.

Other Aspects

Figure 15:
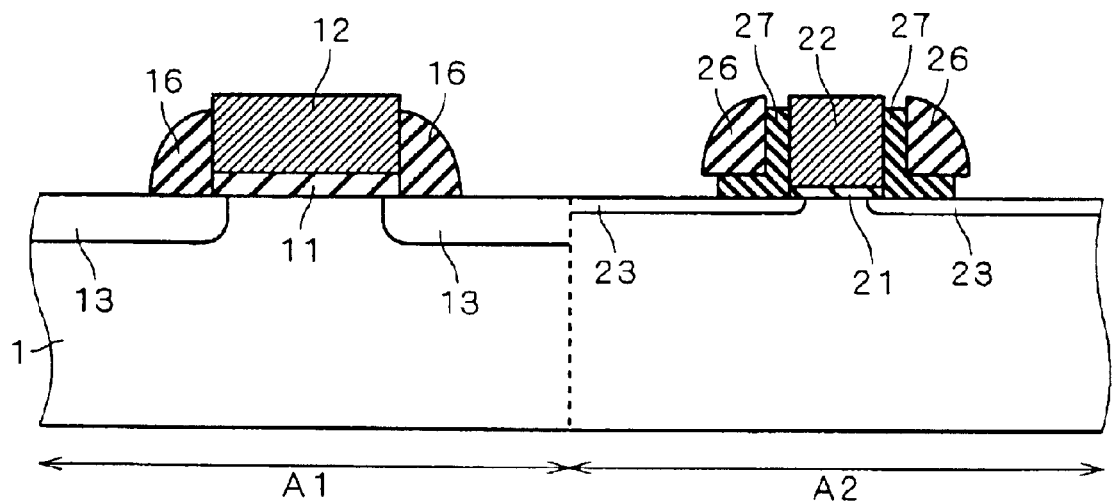
FIG. 15 is a sectional view illustrating a formation of a lower layer sidewall (type 1) in the step shown in FIG. 9.

Referring to FIG. 15, in the high voltage operation region A1, only the upper layer sidewall 16 may be formed on the side surface by performing a wet etching such that only the silicon oxide film 6a is completely removed by using a difference in thickness between the silicon oxide films 6a and 6b in the step of FIG. 9.

Figure 16:
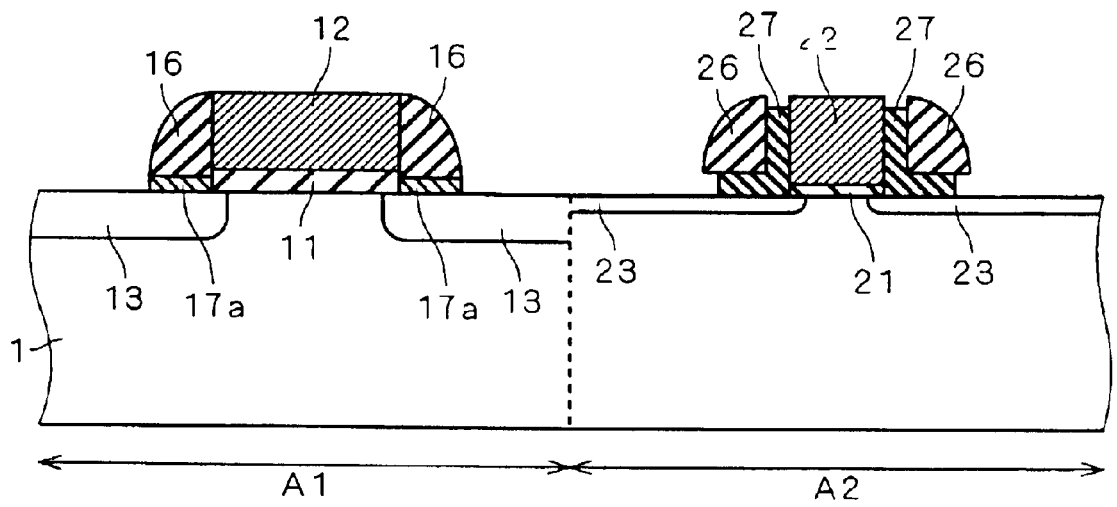
FIG. 16 is a sectional view illustrating a formation of a lower layer sidewall (type 2) in the step shown in FIG. 9.

Referring to FIG. 16, it may be so constructed that part of the silicon oxide film 6a remains as a thermal oxide film 17a, under the upper layer sidewall 16.

Figure 17:
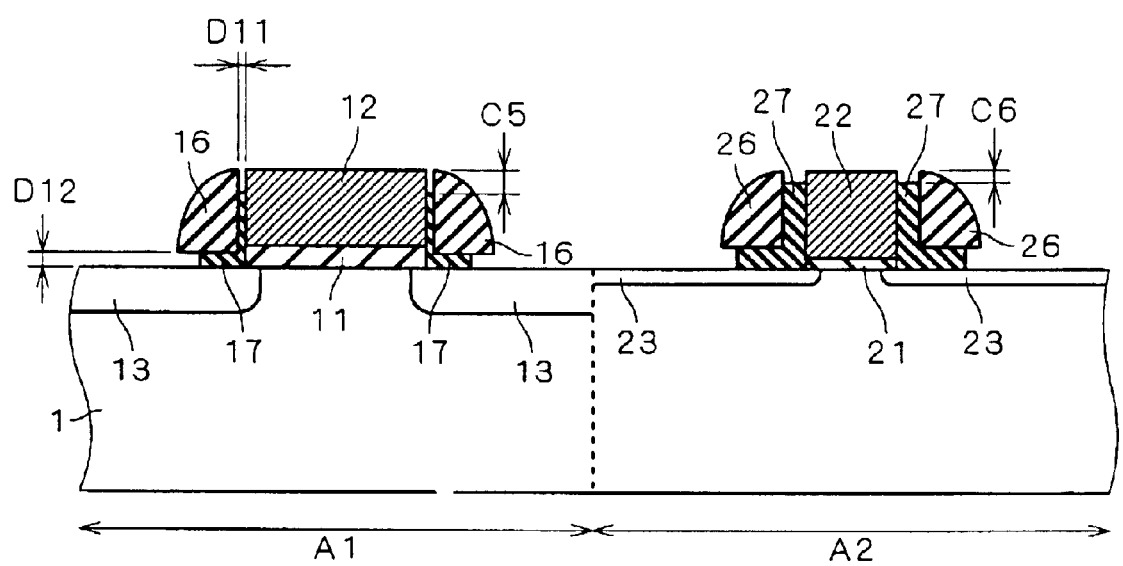
FIG. 17 is a sectional view illustrating a formation of a lower layer sidewall (type 3) in the step shown in FIG. 9.

Referring to FIG. 17, a film thickness D11 of the lower layer sidewall 17 that is adjacent to the gate electrode 12 may be smaller than a film thickness D12 of the lower layer sidewall 17 that is present on the surface of the semiconductor substrate 1 (i.e., the impurity diffusion region 13). When D11=0, the structure of FIG. 16 is obtained.

In all the structures shown in FIGS. 15 to 17, the forming width of the sidewall in the high voltage operation region A1 is narrower than that in the structure of FIG. 9. That is, in the structure of FIG. 15, the size of the sidewall of the MOS transistor Q1 for high voltage is smaller by the amount of absence of the lower layer sidewall 17. In the structure of FIG. 16, the forming width of the sidewall of the MOS transistor Q1 for high voltage is narrower by the amount that the lower layer sidewall 17 is not present in the direction of the forming width. In the structure of FIG. 17, the forming width of the sidewall of the MOS transistor Q1 for high voltage is narrower by the amount that the thickness D11 is smaller than the thickness D12.

Accordingly, with the structures of FIGS. 15 to 17, the driving capability of the MOS transistor Q1 for high voltage to be finally manufactured can be further increased by the amount that the forming width of the sidewall of the high voltage operation region A1 is narrower than that of the structure of FIG. 9.

Second Preferred Embodiment

The manufacturing method of the first preferred embodiment places emphasis on the method of manufacturing a MOS transistor for high voltage and a MOS transistor for low voltage which are of the same conductivity type. A second preferred embodiment is directed to a method of manufacturing a semiconductor device of a CMOS structure.

In the manufacturing method of the second preferred embodiment, the emphasis is particularly on improvement in resistance to hot carrier of a NMOS transistor for high voltage in the CMOS structure.

FIG. 18 is a flowchart illustrating a method of manufacturing a semiconductor device according to the second preferred embodiment. A procedure of the method will be described by referring to FIG. 18. The flowchart of FIG. 18 illustrates a sequence of steps taken after a gate insulating film and a gate electrode are formed in both a high voltage operation region A1 and a low voltage operation region A2, through the steps shown in FIGS. 1 to 3 in the first preferred embodiment.

Step S11 is a first LDD implantation process of a NMOS transistor for low voltage. Step S12 is a first LDD implantation process of a PMOS transistor for low voltage. Step S13 is a first LDD implantation process of a PMOS transistor for high voltage.

Steps S11 to S13 correspond to the first LDD implantation process in the low voltage operation region A2, as shown in FIG. 4 in the first preferred embodiment (The PMOS transistor for high voltage is intentionally manufactured with a construction equivalent to the MOS transistor Q2 for low voltage.). For NMOS transistors, an N type impurity ion is implanted as an impurity ion 24. For PMOS transistors, a P type impurity ion is implanted as an impurity ion 24. The order of steps S11 to S13 is changeable. A pocket implantation process for forming a pocket region may be performed together in steps S11 and S12, respectively.

In step S14, a pre-treatment with a wet process is performed. In step S15, a lower layer sidewall film is formed. Step S15 corresponds to the process of forming the silicon oxide film 6, as shown in FIG. 5 in the first preferred embodiment.

In step S16, a second LDD implantation process of a NMOS transistor for high voltage is performed over the lower layer sidewall film. Step S16 corresponds to the second LDD implantation process in the high voltage operation region A1, as shown in FIG. 6 in the first preferred embodiment.

In step S17, a pre-treatment with a wet process is performed. In step S18, an upper layer sidewall film is formed, and a post-treatment, such as etch back and a treatment with HF (hydrofluoric acid) that is a wet process, is performed to form a sidewall on the side surface of a gate electrode of every MOS transistor. The processes of steps S17 and S18 correspond to the pre-treatment with the wet process and the process of forming the silicon nitride film 7, as shown in FIG. 7 in the first preferred embodiment. The process of step S18 also corresponds to the processes of forming the upper layer sidewall 16 and lower layer sidewall 17, as shown in FIGS. 8 and 9 in the first preferred embodiment, respectively.

In step S19, a source/drain region forming process is performed to all NMOS transistors (for high voltage and for low voltage). In step S20, a source/drain region forming process is performed to all PMOS transistors.

Steps S19 and S20 correspond to the source/drain region forming process as shown in FIG. 10 in the first preferred embodiment. For the NMOS transistors, an impurity ion 8 is an N type impurity ion. For the PMOS transistors, the impurity ion 8 is a P type impurity ion. The order of steps S19 and S20 is changeable.

In step S21, silicide (salicide) is formed on the surface of the source/drain region and on the surface of the gate electrode, resulting in the CMOS structure. Step S21 corresponds to the silicide process as shown in FIG. 12 in the first preferred embodiment.

Thus, the manufacturing method of the second preferred embodiment can provide a semiconductor device of the CMOS structure in which the resulting effects as described in the first preferred embodiment can be obtained only in the NMOS transistors.

Third Preferred Embodiment

Like the second preferred embodiment, a third preferred embodiment relates to a method of manufacturing a semiconductor device of a CMOS structure.

In the manufacturing method of the third preferred embodiment, the emphasis is particularly on improvement in resistance to hot carrier of a PMOS transistor for high voltage as well as a NMOS transistor for high voltage in the CMOS structure.

Figure 19:
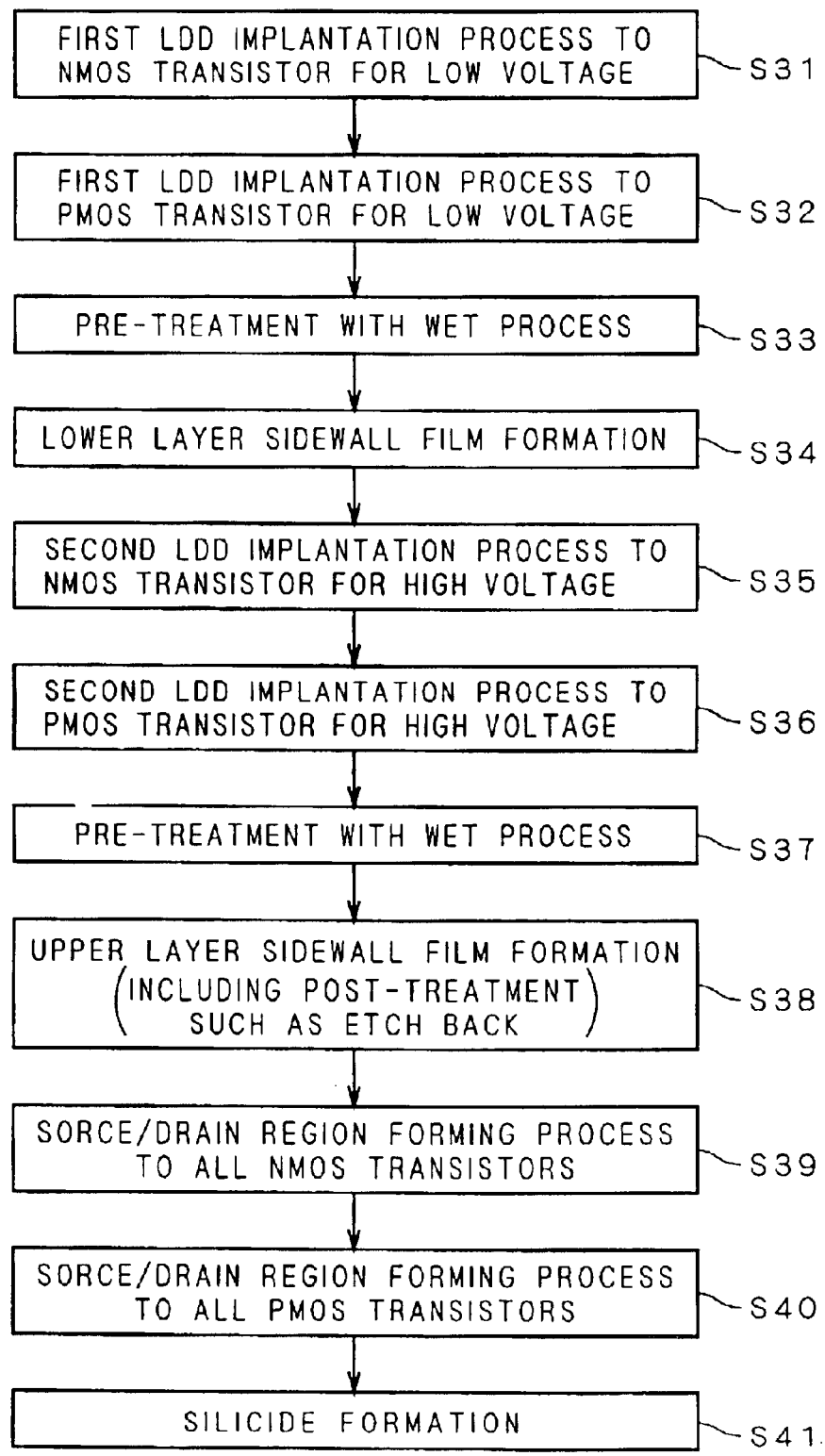
FIG. 19 is a flowchart illustrating a method of manufacturing a semiconductor device according to a third preferred embodiment.

FIG. 19 is a flowchart illustrating a method of manufacturing a semiconductor device according to the third preferred embodiment. A procedure of the method will be described by referring to FIG. 19. The flowchart of FIG. 19 illustrates a sequence of steps taken after a gate insulating film and a gate electrode are formed in both a high voltage operation region A1 and a low voltage operation region A2, through the steps shown in FIGS. 1 to 3 in the first preferred embodiment.

Step S31 is a first LDD implantation process of a NMOS transistor for low voltage. Step S32 is a first LDD implantation process of a PMOS transistor for low voltage.

Steps S31 and S32 correspond to the first LDD implantation process in the low voltage operation region A2, as shown in FIG. 4 in the first preferred embodiment. The order of steps S31 and S32 is changeable. A pocket implantation process for forming a pocket region may be performed together in steps S31 and S32, respectively.

In step S33, a pre-treatment with a wet process is performed. In step S34, a lower layer sidewall film is formed. Step S34 corresponds to the process of forming the silicon oxide film 6, as shown in FIG. 5 in the first preferred embodiment.

In step S35, a second LDD implantation process of a NMOS transistor for high voltage is performed over the lower layer sidewall film. In step S36, a second LDD implantation process of a PMOS transistor for high voltage is performed over the lower layer sidewall film.

Steps S35 and S36 correspond to the second LDD implantation process in the high voltage operation region A1, as shown in FIG. 6 in the first preferred embodiment. The order of steps S35 and S36 is changeable.

In step S37, a pre-treatment with a wet process is performed. In step S38, an upper layer sidewall film is formed, and a post-treatment, such as etch back and a treatment with HF (hydrofluoric acid), is performed to form a sidewall on the side surface of a gate electrode of every MOS transistor.

The processes of steps S37 and S38 correspond to the pre-treatment with the wet process and the process of forming the silicon nitride film 7, as shown in FIG. 7 in the first preferred embodiment. The process of step S38 also corresponds to the processes of forming the upper layer sidewall 16 and lower layer sidewall 17, as shown in FIGS. 8 and 9 in the first preferred embodiment, respectively.

In step S39, a source/drain region forming process is performed to all NMOS transistors. In step S40, a source/drain region forming process is performed to all PMOS transistors.

Steps S39 and S40 correspond to the source/drain region forming process as shown in FIG. 10 in the first preferred embodiment. The order of steps S39 and S40 is changeable.

In step S41, silicide (salicide) is formed on the surface of the source/drain region and on the surface of the gate electrode, resulting in the CMOS structure. Step S41 corresponds to the silicide process as shown in FIG. 12 in the first preferred embodiment.

Thus, the manufacturing method of the third preferred embodiment can provide a semiconductor device of the CMOS structure in which the resulting effects as described in the first preferred embodiment can be obtained in both the NMOS and PMOS transistors.

Fourth Preferred Embodiment Like the second preferred embodiment, a fourth preferred embodiment relates to a method of manufacturing a semiconductor device of a CMOS structure.

Consider the case of forming a MOS transistor for low voltage of which channel length is extremely short, for example, 0.18 μm or less. In the case of PMOS transistors for low voltage, at the same energy, an LDD region can be formed shallower by a second LDD implantation process over a lower layer sidewall, than a first LDD implantation process. This allows for an improvement in short channel characteristic.

In the manufacturing method of the fourth preferred embodiment, the emphasis is on improvement in resistance to hot carrier of a NMOS transistor for high voltage and in short channel characteristic of a PMOS transistor for low voltage, in the CMOS structure.

Figure 20:
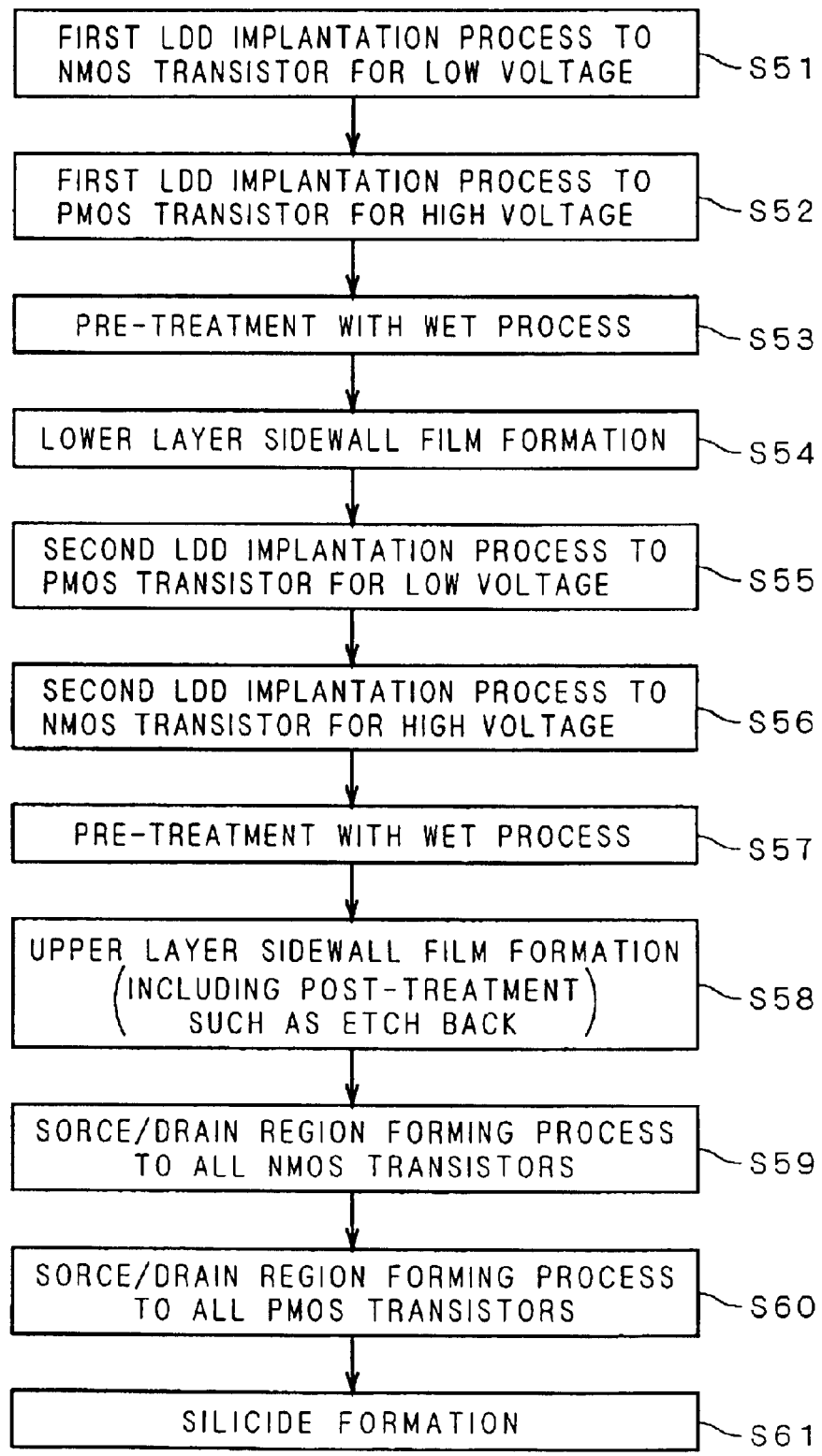
FIG. 20 is a flowchart illustrating a method of manufacturing a semiconductor device according to a fourth preferred embodiment.

FIG. 20 is a flowchart illustrating a method of manufacturing a semiconductor device according to the fourth preferred embodiment. A procedure of the method will be described by referring to FIG. 20. The flowchart of FIG. 20 illustrates a sequence of steps taken after a gate insulating film and a gate electrode are formed in both a high voltage operation region A1 and a low voltage operation region A2, through the steps shown in FIGS. 1 to 3 in the first preferred embodiment.

Step S51 is a first LDD implantation process of a NMOS transistor for low voltage. Step S52 is a first LDD implantation process of a PMOS transistor for high voltage.

Steps S51 and S52 correspond to the first LDD implantation process in the low voltage operation region A2, as shown in FIG. 4 in the first preferred embodiment (The PMOS transistor for high voltage is intentionally manufactured with a construction equivalent to the MOS transistor Q2 for low voltage.). The order of steps S51 and S52 is changeable. A pocket implantation process for forming a pocket region may be performed together in step S51.

In step S53, a pre-treatment with a wet process is performed. In step S54, a lower layer sidewall film is formed.

Step S54 corresponds to the process of forming the silicon oxide film 6 as shown in FIG. 3 in the first preferred embodiment.

In step S55, a second LDD implantation process of a PMOS transistor for low voltage is performed over the lower layer sidewall film. In step S56, a second LDD implantation process of a NMOS transistor for high voltage is performed over the lower layer sidewall film.

Steps S55 and S56 correspond to the second LDD implantation process in the high voltage operation region A1 as shown in FIG. 6 in the first preferred embodiment (The PMOS transistor for low voltage is intentionally manufactured with a construction equivalent to the MOS transistor Q1 for high voltage in the first preferred embodiment.). The order of steps S55 and S56 is changeable. A pocket implantation process for forming a pocket region may be performed together in step S55.

In step S57, a pre-treatment with a wet process is performed. In step S58, an upper layer sidewall film is formed, and a post-treatment, such as etch back and a treatment with HF (hydrofluoric acid), is performed to form a sidewall on the side surface of a gate electrode of every MOS transistor.

The processes of steps S57 and S58 correspond to the pre-treatment with the wet process and the process of forming the silicon nitride film 7, as shown in FIG. 7 in the first preferred embodiment. The process of step S58 also corresponds to the processes of forming the upper layer sidewall 16 and lower layer sidewall 17, as shown in FIGS. 8 and 9 in the first preferred embodiment, respectively.

In step S59, a source/drain region forming process is performed to all the NMOS transistors. In step S60, a source/drain region forming process is performed to all the PMOS transistors.

Steps S59 and S60 correspond to the source/drain region forming process as shown in FIG. 10 in the first preferred embodiment. The order of steps S59 and S60 is changeable.

In step S61, silicide (salicide) is formed on the surface of the source/drain region and on the surface of the gate electrode, resulting in the CMOS structure. Step S61 corresponds to the silicide process as shown in FIG. 12 in the first preferred embodiment.

Thus, the manufacturing method of the fourth preferred embodiment can provide a semiconductor device of the CMOS structure in which the resulting effects as described in the first preferred embodiment can be obtained in the NMOS transistors, and short channel characteristic is improved in the PMOS transistors for low voltage.

Fifth Preferred Embodiment

Like the second preferred embodiment, a fifth preferred embodiment relates to a method of manufacturing a semiconductor device of a CMOS structure.

In the manufacturing method of the fifth preferred embodiment, the emphasis is on improvement in resistance to hot carrier of a NMOS transistor for high voltage and a PMOS transistor for high voltage, and improvement in short channel characteristic of a PMOS transistor for low voltage, in the CMOS structure.

Figure 21:
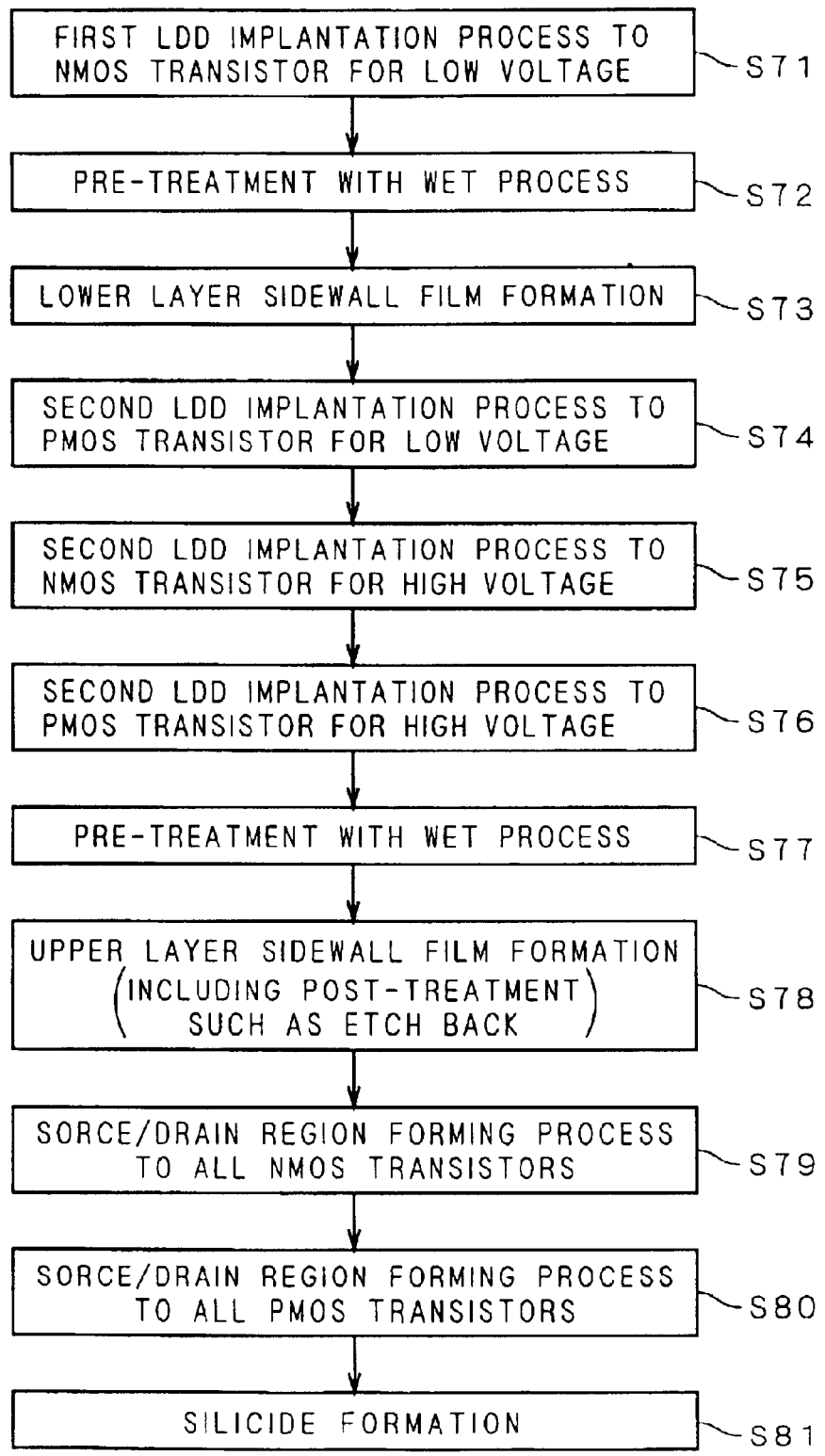
FIG. 21 is a flowchart illustrating a method of manufacturing a semiconductor device according to a fifth preferred embodiment.

FIG. 21 is a flowchart illustrating a method of manufacturing a semiconductor device according to the fifth preferred embodiment. A procedure of the method will be described by referring to FIG. 21. The flowchart of FIG. 21 illustrates a sequence of steps taken after a gate insulating film and a gate electrode are formed in both a high voltage operation region A1 and a low voltage operation region A2, through the steps shown in FIGS. 1 to 3 in the first preferred embodiment.

Step S71 is a first LDD implantation process of a NMOS transistor for low voltage. Step S71 corresponds to the first LDD implantation process in the low voltage operation region A2, as shown in FIG. 4 in the first preferred embodiment. A pocket implantation process for forming a pocket region may be performed together in step S71.

In Step S72, a pre-treatment with a wet process is performed. In step S73, a lower layer sidewall film is formed. Step S73 corresponds to the process of forming the silicon oxide film 6 as shown in FIG. 5 in the first preferred embodiment.

In step S74, a second LDD implantation process of a PMOS transistor for low voltage is performed over the lower layer sidewall film. In step S75, a second LDD implantation process of a NMOS transistor for high voltage is performed over the lower layer sidewall film. In step S76, a second LDD implantation process of a PMOS transistor for high voltage is performed over the lower layer sidewall film.

Steps S74 to S76 correspond to the second LDD implantation process in the high voltage operation region A1 as shown in FIG. 6 in the first preferred embodiment (The PMOS transistor for low voltage is intentionally manufactured with a construction equivalent to the MOS transistor Q1 for high voltage in the first preferred embodiment.). The order of steps S74 to S76 is changeable. A pocket implantation process for forming a pocket region may be performed together in step S74.

In step S77, a pre-treatment with a wet process is performed. In step S78, an upper layer sidewall film is formed, and a post-treatment, such as etch back and a treatment with HF (hydrofluoric acid), is performed to form a sidewall on the side surface of a gate electrode of every MOS transistor.

The processes of steps S77 and S78 correspond to the pre-treatment with the wet process and the process of forming the silicon nitride film 7, as shown in FIG. 7 in the first preferred embodiment. The process of step S78 also corresponds to the processes of forming the upper layer sidewall 16 and lower layer sidewall 17, as shown in FIGS. 8 and 9 in the first preferred embodiment, respectively.

In step S79, a source/drain region forming process is performed to all the NMOS transistors. In step S80, a source/drain region forming process is performed to all the PMOS transistors. The order of steps S79 and S80 is changeable. Steps S79 and S80 correspond to the source/drain region forming process as shown in FIG. 10 in the first preferred embodiment.

In step S81, silicide (salicide) is formed on the surface of the source/drain region and on the surface of the gate electrode, resulting in the CMOS structure. Step S81 corresponds to the silicide process as shown in FIG. 12 in the first preferred embodiment.

Thus, the manufacturing method of the fifth preferred embodiment can provide a semiconductor device of the CMOS structure in which the resulting effects as described in the first preferred embodiment can be obtained in the NMOS transistors and the PMOS transistors for high voltage, and short channel characteristic is improved in the PMOS transistors for low voltage.

Sixth Preferred Embodiment

Figure 22:
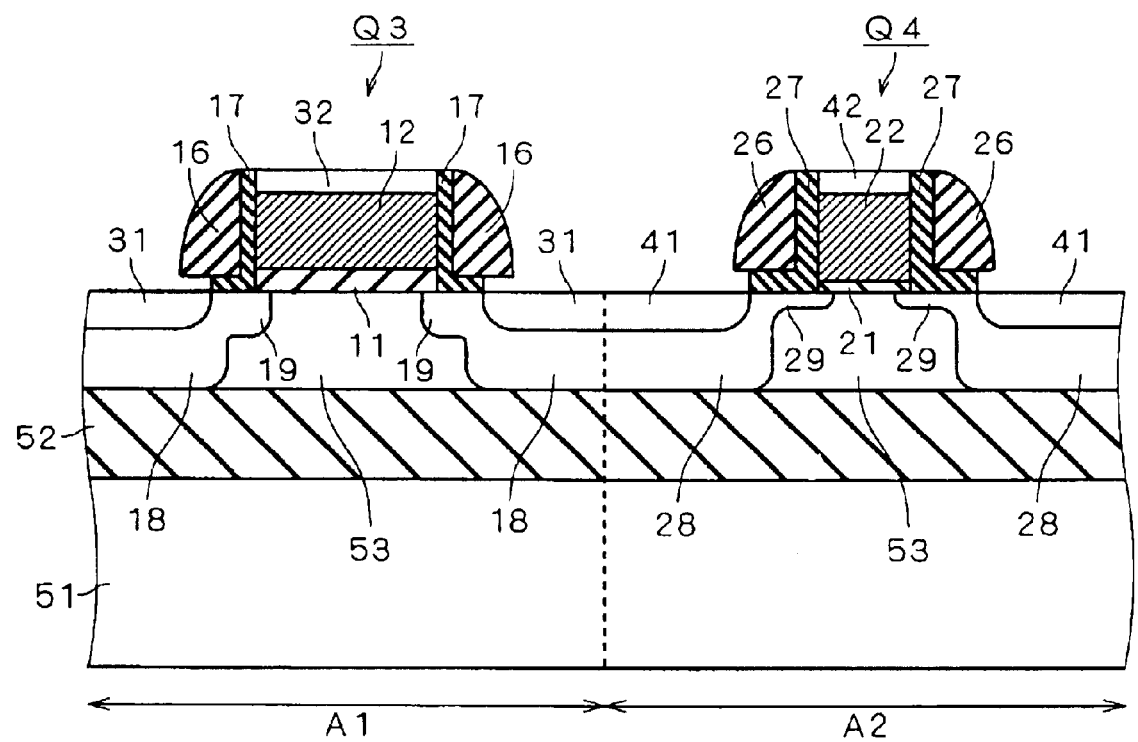
FIG. 22 is a sectional view illustrating a structure of a semiconductor device according to a sixth preferred embodiment.

FIG. 22 is a sectional view illustrating a construction of a semiconductor device according to a sixth preferred embodiment. As shown in FIG. 22, this semiconductor device differs from the semiconductor device of the first preferred embodiment shown in FIG. 13, in the points that the semiconductor substrate 1 is replaced with a SOI substrate (silicon substrate 51, buried oxide film 52 and SOI layer 53), and that a source/drain region 18 of a MOS transistor Q3 for high voltage and a source/drain region 28 of a MOS transistor Q4 for low voltage are formed from the surface to the back of the SOI layer 53. Otherwise, the construction is similar to that of the first preferred embodiment and a description thereof is thus omitted.

With the SOI structure shown in FIG. 22, it is very difficult to increase resistance to hot carrier by a parasitic bipolar transistor effect, and this is particularly noticeable in the MOS transistor Q3 for high voltage formed in a high voltage operation region A1.

It is however able to obtain the same effects as the first preferred embodiment by executing the method of manufacturing a semiconductor device of the first preferred embodiment on the SOI substrate.

In order to further improve the characteristic of the MOS transistor Q3 for high voltage, it is effective to apply a body fixing structure for fixing the potential of a body region of a MOS transistor to the SOI layer 53.

Figure 23:
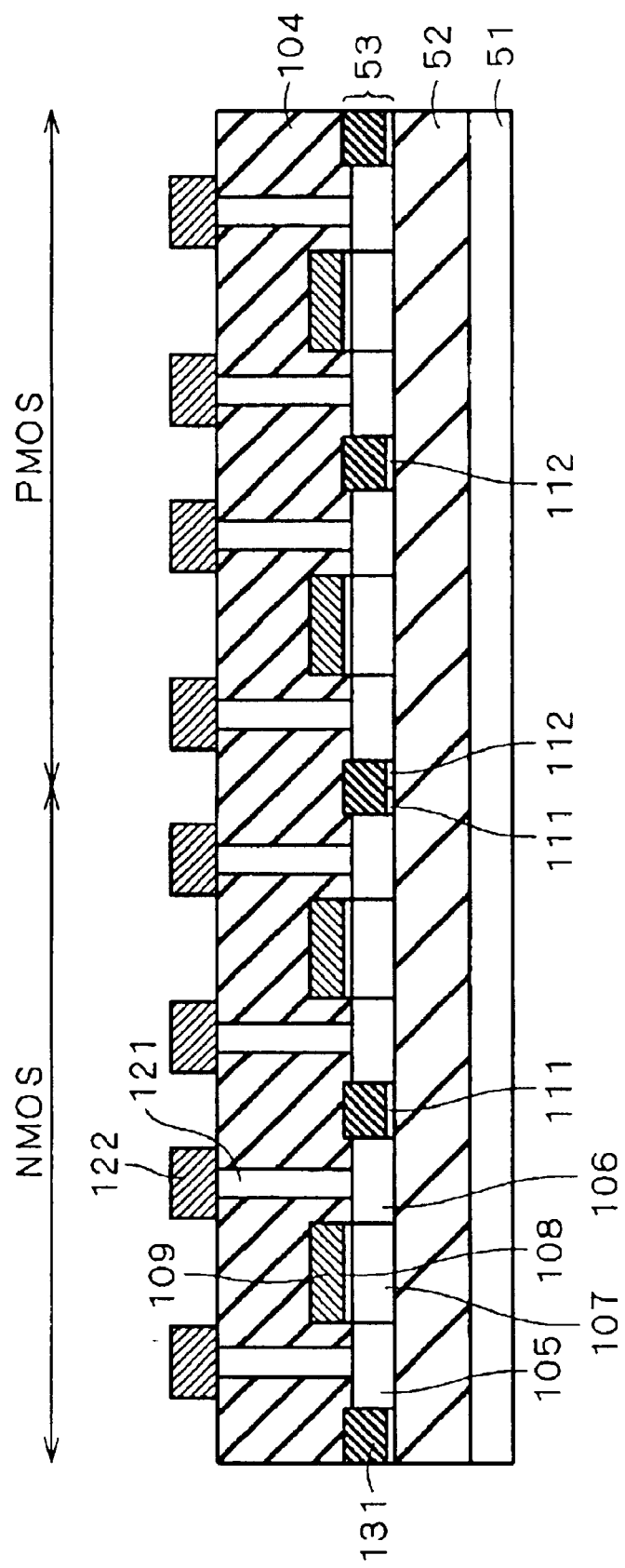
FIG. 23 is a sectional view illustrating a partial trench isolation structure of the sixth preferred embodiment.
Figure 24:
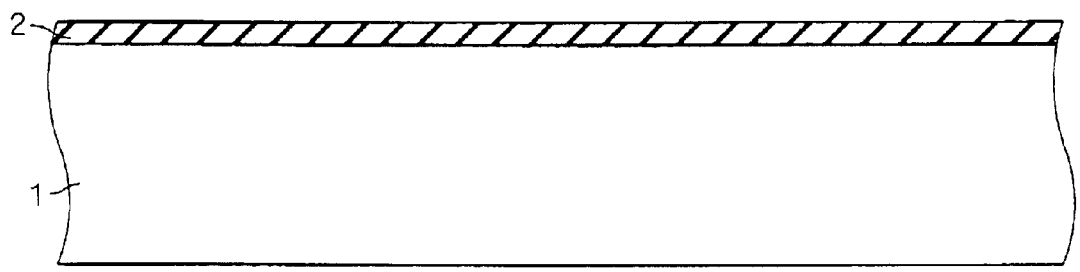
FIGS. 24 to 28 are sectional views illustrating a sequence of steps in a conventional method of manufacturing a semiconductor device.
Figure 25:
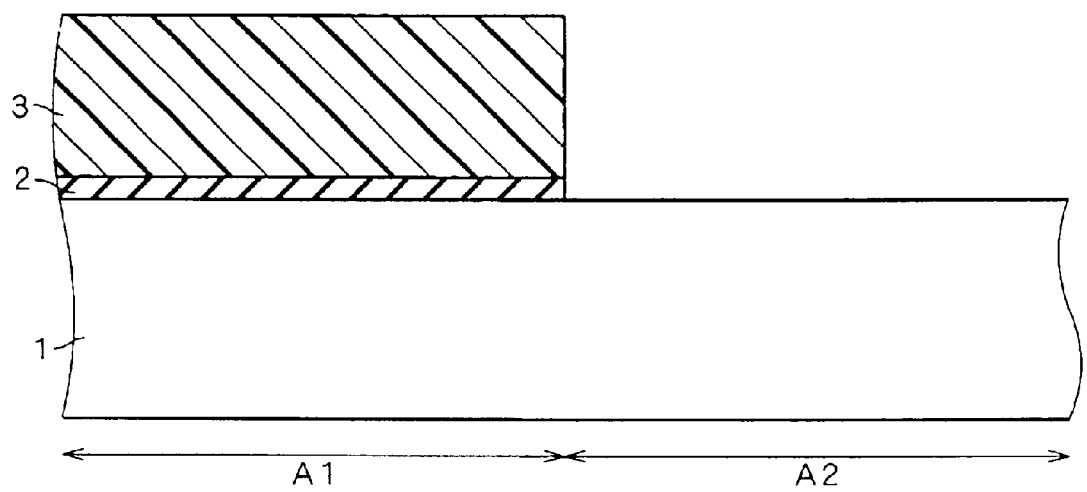
Figure 26:
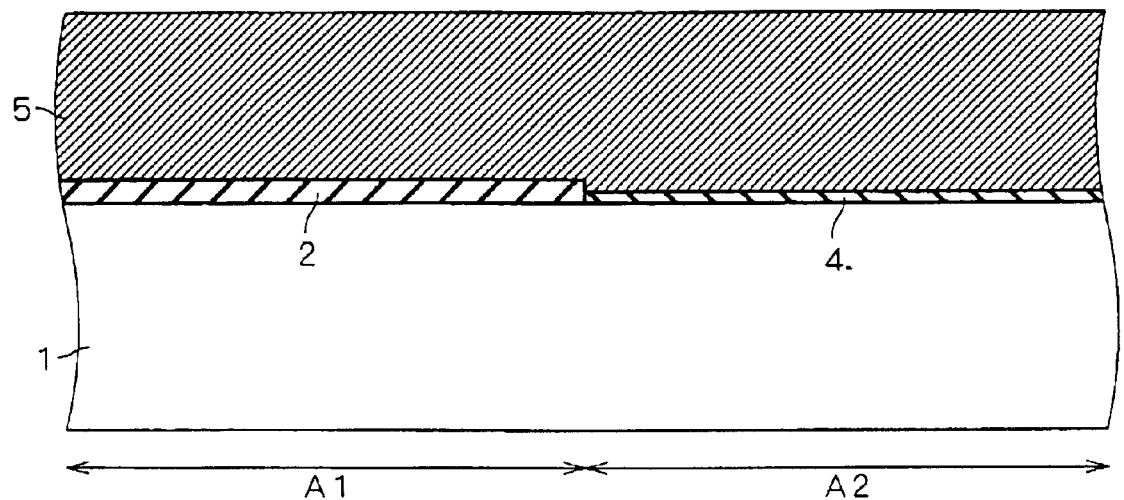
Figure 27:
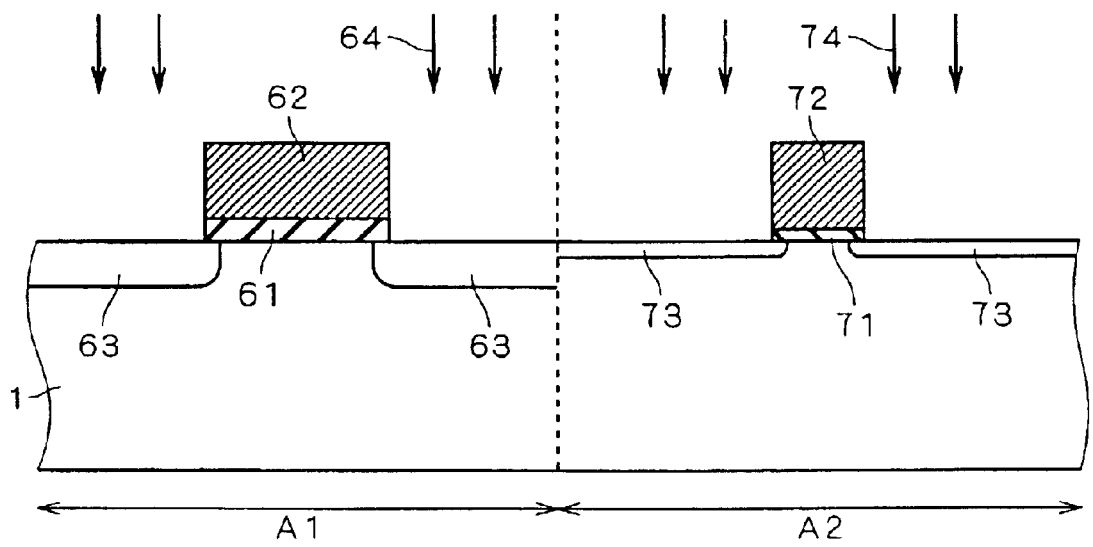
Figure 28:
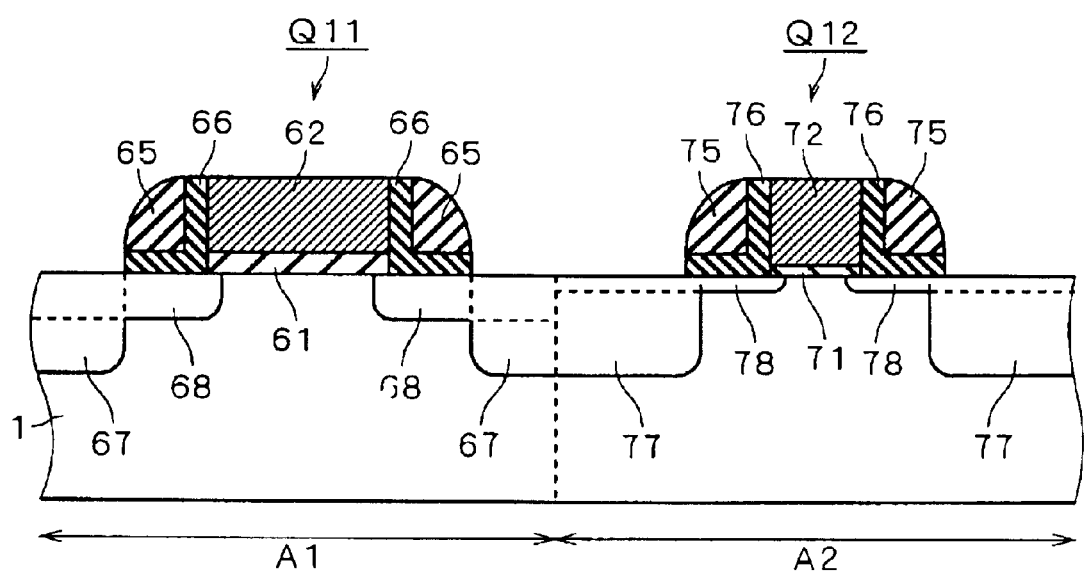
Figure 29:
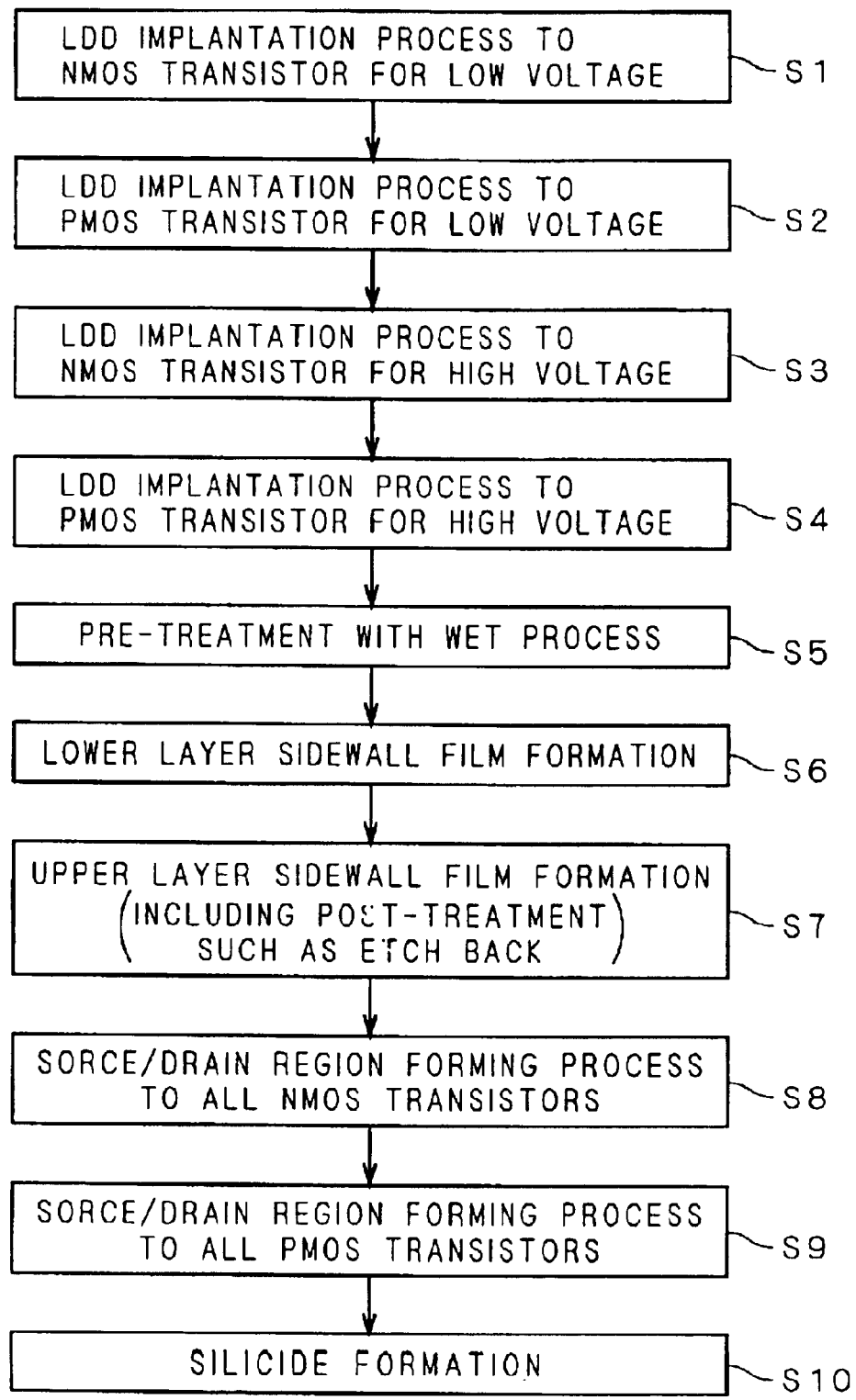
FIG. 29 is a flowchart illustrating a procedure of manufacturing a semiconductor device of a CMOS structure by using the conventional method.

FIG. 23 is a sectional view illustrating a SOI structure obtained by a partial trench isolation. As shown in FIG. 23, each transistor forming region of a SOI layer 53 is isolated by a partial oxide film 131, a lower layer part of which is provided with a well region. A p type well region 111 is disposed in a lower layer of the partial oxide film 131 isolating NMOS transistors from each other. An n type well region 112 is disposed in a lower layer of the partial oxide film 131 isolating PMOS transistors from each other. The p type well region 111 (on the NMOS transistor side) and the n type well region 112 (on the PMOS transistor side) are disposed in a lower layer of the partial oxide film 131 isolating the NMOS transistors and PMOS transistors. The well region 111 is formed so as to surround a drain region 105 and a source region 106 of the NMOS transistor group, and the well region 112 is formed so as to surround a drain region 105 and a source region 106 of the PMOS transistor group. An interlayer insulating film 104 covers the surface of the SOI layer 53.

In this structure, a unit of MOS transistor isolated from other transistor by the partial oxide film 131 comprises the drain region 105, source region 106 and channel forming region 107, which are formed in the SOI layer 53; a gate oxide film 108 formed on the channel forming region 107; and a gate electrode 109 firmed on the gate oxide film 108. A wiring layer 122 formed on the interlayer insulating film 104 is electrically connected via a contact 121 to the drain region 105 or source region 106.

A body region (not shown in FIG. 23) is formed between the well regions 111 in the SOI layer 53, and the body region is in contact with the adjacent well region 111. A wiring layer for body region (not shown) formed on the interlayer insulating film 104 is electrically connected to the body region via a body contact (not shown) disposed in the interlayer insulating film 104.

Thus, in the semiconductor device of the partial trench isolation structure, as shown in FIG. 23, the partial oxide film 131 in an element isolation region does not reach a lower part of the SOI layer 53. Disposed in a lower layer of the partial oxide film 131 are the well regions 111 and 112, into which impurity of the same conductivity type as the channel forming region of the transistors to be isolated has been introduced.

Therefore, the substrate potential of each transistor can be fixed via the wiring layer for body region, body contact, body region having a high concentration, and well region 111. Similarly on the PMOS transistor side, the substrate potential of each transistor can be fixed via the wiring layer for body region, body contact, body region having a high concentration, and well region 111.

The partial trench isolation structure as described is, for example, disclosed in Japanese Patent Unexamined Publications No. 11-177091 (1999) and No. 2000-39484, and "Bulk-Layout-Compatible 0.18 μm SOI-CMOS Technology Using Body-Fixed Partial Trench Isolation (PTI)" by Y. Hirano et al., 1999 IEEE International SOI Conference, October 1999.

Seventh Preferred Embodiment

When a lower layer sidewall film is formed from a TEOS oxide film, the following disadvantage occurs. That is, if it is deposited at a relatively low temperature of 700° C., for example, the impurity implanted into an impurity diffusion region, channel region or pocket region, which are formed by the previous LDD implantation process, is abnormally diffused due to TED (transient enhanced diffusion) phenomenon.

To avoid this disadvantage, it is preferable to perform, for example, before forming a TEOS oxide film, a RTA (rapid thermal annealing, i.e., a first RTA) in an atmosphere of nitrogen at a relatively high temperature of 900° C. for about 30 minutes.

When an upper layer sidewall film is formed from a silicon nitride film, its deposition at about 720° C. might cause the TED phenomenon because of the same reason as described. To avoid this, it is desirable to perform a RTA (a second RTA).

The method of manufacturing a semiconductor device according to the seventh preferred embodiment is characterized by incorporating the mentioned RTA process into a sequence of steps. However, the second RTA process is not necessarily required but the first RTA process is essential.

In the case of the method of the second preferred embodiment shown in FIG. 18, the ideal timing of the first RTA process is immediately before step S15. However, if there is a fear that due to the first RTA process, the degree of diffusion is increased to degrade short channel characteristic, it may be immediately before step S12 or S13. The timing of the second RTA process is preferably immediately before step S118.

In the case of the method of the third preferred embodiment shown in FIG. 19, the ideal timing of the first RTA process is immediately before step S34. However, if there is a fear of degradation in short channel characteristic as above described, it may be immediately before step S32. The timing of the second RTA process is preferably immediately before step S38.

In the case of the method of the fourth preferred embodiment shown in FIG. 20, the ideal timing of the first RTA process is immediately before step S54. However, if there is a fear of degradation in short channel characteristic as above described, it may be immediately before step S52. The timing of the second RTA process is preferably immediately before step S58.

In the case of the method of the fifth preferred embodiment shown in FIG. 21, the ideal timing of the first RTA process is immediately before step S73. The timing of the second RTA process is preferably immediately before step S78.

Eighth Preferred Embodiment

When a lower layer sidewall film is formed from a HTO film, it is deposited at a relatively high temperature of 750 to 850° C. This enables to further reduce the trap state at the interface between a semiconductor substrate 1 and the lower layer sidewall film, thus allowing for a further improvement in resistance to hot carrier of a MOS transistor Q1 for high voltage.

When a lower layer sidewall film is formed from a TEOS oxide film, resistance to hot carrier can be increased although it is inferior to that with the HTO film.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device containing first and second transistors of an insulating gate type formed in a semiconductor substrate, comprising the steps of:
   (a) forming first and second gate insulating films in first and second regions on said semiconductor substrate, respectively, the surface of said semiconductor substrate under said first and second gate insulating films being defined as first and second channel regions, respectively;
   (b) forming first and second gate electrodes on said first and second gate insulating films, respectively;
   (c) forming a second impurity diffusion region by introducing impurity only to said second region by using said second gate electrode as a mask;
   (d) forming a lower layer sidewall film on the entire surface;
   (e) forming a first impurity diffusion region by introducing impurity only to said first region over said lower layer sidewall film by using said first gate electrode as a mask;
   (f) forming an upper layer sidewall film on the entire surface;
   (g) performing an etch back process to said upper layer sidewall film so that on the side surfaces of said first and second gate electrodes, first and second upper layer sidewalls are formed with said lower layer sidewall film interposed therebetween;
   (h) selectively removing said lower layer sidewall film to form first and second lower layer sidewalls on the side surfaces of said first and second gate electrodes and on the surface of said semiconductor substrate beneath said first and second upper layer sidewalls; and
   (i) forming a first source/drain region by introducing impurity by using said first upper layer and lower layer sidewalls and said first gate electrode as a mask, and forming a second source/drain region by introducing impurity by using slid second upper layer and lower layer sidewalls and said second gate electrode a a mask, said first impurity diffusion region adjacent to said first source/drain region in the direction of said first gate electrode being defined as a first LDD region, said second impurity diffusion region adjacent to said second source/drain region in the direction of said second gate electrode being defined as a second LDD region,
   wherein said first transistor comprises said first gate insulating film, said first gate electrode, said first upper layer sidewall, said first lower layer sidewall, said first source/drain region and said first LDD region, and said second transistor comprises said second gate insulating film, said second gate electrode, said second upper layer sidewall, said second lower layer sidewall, said second source/drain region and said second LDD region.

2. The method of manufacturing a semiconductor device according to claim 1, wherein
   said first transistor includes a NMOS transistor for high voltage, and
   said second transistor includes a NMOS transistor for low voltage, a PMOS transistor for low voltage and a PMOS transistor for high voltage.

3. The method of manufacturing a semiconductor device according to claim 1, wherein
   said first transistor includes a NMOS transistor for high voltage and a PMOS transistor for high voltage, and
   said second transistor includes a NMOS transistor for low voltage and a PMOS transistor for low voltage.

4. The method of manufacturing a semiconductor device according to claim 1, wherein
   said first transistor includes a NMOS transistor for high voltage and a PMOS transistor for low voltage, and
   said second transistor includes an NMOS transistor for low voltage and a PMOS transistor for high voltage.

5. The method of manufacturing a semiconductor device according to claim 1, wherein
   said first transistor includes a NMOS transistor for high voltage, a PMOS transistor for high voltage and a PMOS transistor for low voltage, and
   said second transistor includes a NMOS transistor for low voltage.

6. The method of manufacturing a semiconductor device according to claim 1, further comprising the step of:
   (j) performing, before said step (d), a RTA (rapid thermal annealing) process.

7. The method of manufacturing a semiconductor device according to claim 1, wherein
   said step (d) includes the step of forming said lower layer sidewall film by using TEOS as a material.

8. The method of manufacturing a semiconductor device according to claim 1, wherein
   said step (d) includes the step of forming said lower layer sidewall film by using a high temperature CVD thermal film as a material.

9. The method of manufacturing a semiconductor device according to claim 1, further comprising the step of:
   (k) performing, between said steps (e) and (f), a pre-treatment with a wet process.

10. The method of manufacturing a semiconductor device according to claim 9, wherein
    said step (h) includes the step of removing said lower layer sidewall film by a wet etching.

11. The method of manufacturing a semiconductor device according to claim 1, wherein
    said step (e) includes the step of introducing nitrogen into said first impurity diffusion region.

* * * * *